(12) United States Patent
Kocon et al.

(10) Patent No.: US 12,317,539 B2
(45) Date of Patent: *May 27, 2025

(54) HYBRID COMPONENT WITH SILICON AND WIDE BANDGAP SEMICONDUCTOR MATERIAL IN SILICON RECESS WITH NITRIDE SPACER

(71) Applicant: Texas Instruments Incorporated, Dallas, TX (US)

(72) Inventors: Christopher Boguslaw Kocon, Mountain Top, PA (US); Henry Litzmann Edwards, Garland, TX (US); Curry Bachman Taylor, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

This patent is subject to a terminal disclaimer.

(21) Appl. No.: 17/487,209

(22) Filed: Sep. 28, 2021

(65) Prior Publication Data

US 2022/0271159 A1 Aug. 25, 2022

Related U.S. Application Data

(60) Provisional application No. 63/152,400, filed on Feb. 23, 2021.

(51) Int. Cl.
*H01L 29/78* (2006.01)
*H10D 30/01* (2025.01)
(Continued)

(52) U.S. Cl.
CPC ......... *H10D 30/65* (2025.01); *H10D 30/0281* (2025.01); *H10D 64/111* (2025.01)

(58) Field of Classification Search
CPC ............... H01L 29/7816; H01L 29/402; H01L 29/66681; H01L 29/7391; H01L 29/165; H01L 29/267; H01L 29/66325; H01L 29/66636; H01L 29/66659; H01L 29/7835; H01L 29/1083; H01L 29/42368; H01L 29/665; H01L 29/0847; H01L 29/7393; H01L 29/7834; H01L 29/0834;
(Continued)

(56) References Cited

U.S. PATENT DOCUMENTS

| | | | |
|---|---|---|---|
| 2011/0049620 A1* | 3/2011 | Chen | H01L 29/7816 438/296 |
| 2020/0335623 A1* | 10/2020 | Shin | H01L 29/7816 |
| 2022/0271158 A1 | 8/2022 | Kocon | |

* cited by examiner

*Primary Examiner* — Mohammed R Alam
(74) *Attorney, Agent, or Firm* — Yudong Kim; Frank D. Cimino

(57) ABSTRACT

A microelectronic device includes a hybrid component. The microelectronic device has a substrate including silicon semiconductor material. The hybrid component includes a silicon portion in the silicon, and a wide bandgap (WBG) structure in a silicon recess on the silicon portion of the hybrid device. The silicon recess contains a silicon recess nitride sidewall. The WBG structure includes a WBG semiconductor material having a bandgap energy greater than a bandgap energy of the silicon. The hybrid component has a first current terminal on the silicon, and a second current terminal on the WBG structure. The microelectronic device may be formed by forming the silicon portion of the hybrid component in the silicon, and subsequently forming the WBG structure in a silicon recess on the silicon.

20 Claims, 13 Drawing Sheets

(51) Int. Cl.
*H10D 30/65* (2025.01)
*H10D 64/00* (2025.01)

(58) Field of Classification Search
CPC .......................... H01L 29/0696; H10D 30/65; H10D 30/0281; H10D 64/111; H10D 30/603; H10D 18/00; H10D 48/074; H10D 30/0196; H10D 30/0229; H10D 30/87; H10D 62/199; H10D 84/903; H10D 89/911; H10D 84/144; H10D 44/466; A61K 40/4233; A61K 40/33; H10F 71/133; H10F 77/164; H10F 30/283

See application file for complete search history.

HYBRID COMPONENT WITH SILICON AND WIDE BANDGAP SEMICONDUCTOR MATERIAL IN SILICON RECESS WITH NITRIDE SPACER

CROSS-REFERENCE TO RELATED APPLICATIONS

This application is related to U.S. Provisional Patent Application No. 63/152,400, filed on Feb. 23, 2021, and hereby incorporated herein by reference in its entirety.

FIELD

This disclosure relates to the field of microelectronic devices. More particularly, but not exclusively, this disclosure relates to semiconductor components having wide bandgap semiconductor material in microelectronic devices.

BACKGROUND

Semiconductor components are being continually improved to operate at higher potentials and to provide lower resistances to current flow. Fabricating reliable semiconductor components that have increasingly higher performance is challenging.

SUMMARY

The present disclosure introduces a microelectronic device including a hybrid component. The microelectronic device has a substrate including silicon semiconductor material. The hybrid component includes a silicon portion in the silicon, and a wide bandgap (WBG) structure in a silicon recess on the silicon portion of the hybrid device. The silicon recess contains a silicon recess nitride sidewall. The WBG structure includes a WBG semiconductor material having a bandgap energy greater than a bandgap energy of the silicon. The hybrid component has a first current terminal on the silicon, and a second current terminal on the WBG structure. The microelectronic device may be formed by forming the silicon portion of the hybrid component in the silicon, and forming the WBG structure in a recess in the silicon.

DETAILED DESCRIPTION

Figure 1:
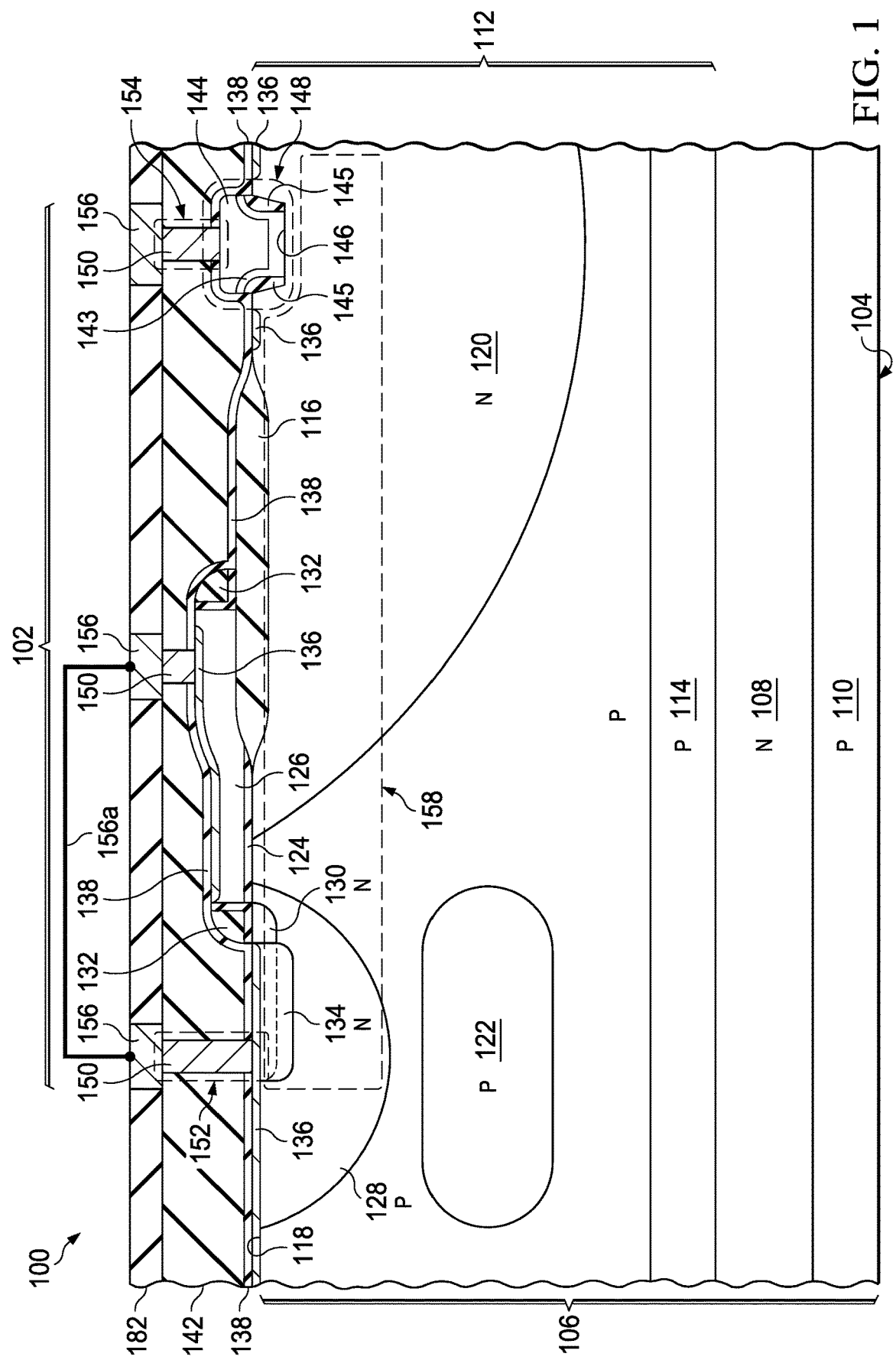
FIG. 1 is a cross section of an example microelectronic device having a hybrid component with a WBG structure and a WBG gradient semiconductor material between the WBG semiconductor material and the silicon semiconductor material.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

The following co pending patent applications have related subject matter and are hereby incorporated by reference: U.S. patent application Ser. No. 17/487,149, titled "HYBRID COMPONENT WITH SILICON AND WIDE BANDGAP SEMICONDUCTOR MATERIAL", by Kocon, et al.), and U.S. patent application Ser. No. 17/487,187, titled "HYBRID COMPONENT WITH SILICON AND WIDE BANDGAP SEMICONDUCTOR MATERIAL IN SILICON RECESS", by Kocon, et al.), both filed simultaneously with this application. With their mention in this section, these patent applications are not admitted to be prior art with respect to the present invention.

A microelectronic device is formed in and on a substrate that includes silicon semiconductor material, referred to herein as the silicon. The silicon has a top surface, which has a recess. The microelectronic device includes a hybrid component. The hybrid component includes a silicon portion in the silicon, and a wide bandgap (WBG) structure with WBG semiconductor material on the silicon in the recess with a nitride spacer around the WBG semiconductor material. The hybrid component may be manifested as a laterally diffused metal oxide semiconductor (LDMOS) transistor, a drain extended metal oxide semiconductor (DEMOS) transistor, a bipolar junction transistor, a junction field effect transistor, a gated bipolar, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, or a Schottky diode, by way of example.

In an LDMOS transistor for example, by adding the WBG semiconductor material in the recess with the nitride spacer in series with the silicon drift region, additional drain voltage can be tolerated before breakdown occurs. Due to the high breakdown field strength of WBG semiconductors, the thickness of WBG semiconductor material needed to sustain a given voltage drop is much less than silicon. For example, the 30V capability of a silicon LDMOS could be increased to 60V or 100V or more by adding increasingly thicker layers of WBG semiconductor material to the drain region without increasing the areal footprint of the LDMOS. Having the WBG structure in the recess with the nitride spacer directs current to a bottom of the recess and provides more uniform current density between the WBG semiconductor material and the silicon. A similar concept applies to other device types described above where adding a WBG semiconductor material in a current path between terminals of a device increases the breakdown voltage between those terminals to a greater extent (for a given thickness) than silicon.

The WBG semiconductor material extends into the recess in the silicon, and is laterally surrounded by the nitride spacer. The nitride spacer directs current to a bottom of the silicon recess and provides more uniform current density between the WBG semiconductor material and the silicon. In some examples, the WBG structure may include metal silicide between the WBG semiconductor material and the silicon. In some examples, the WBG structure may include an interface layer between the WBG semiconductor material and the silicon. The interface layer may provide a nucleation layer to facilitate formation of the WBG semiconductor material. The interface layer may consist of multiple layers with increasing lattice constant to minimize effects of large difference in lattice constants between the silicon and the WBG semiconductor material. The interface layer may provide a stress relief layer to accommodate difference in lattice constants between the silicon and the WBG semiconductor material. The interface layer may provide an ohmic layer to reduce electrical resistance in the hybrid component. In some versions of the microelectronic device, the interface layer may be recessed from lateral boundaries of the WBG semiconductor material. In some versions of the microelectronic device, the interface layer may be laterally heterogeneous, that is, may have a varying composition in one or two lateral directions. The interface layer may include, by way of example, a refractory metal, a metal of the platinum group, graphene, a rare earth metal, two-dimensional materials such as two-dimensional metal carbide, two-dimensional tin, metal carbonitride, a metal nitride, chalcogenides, hexagonal boron nitride, and or molybdenum compounds.

In some examples, the WBG structure may include both a metal silicide layer and an interface layer. In versions of the hybrid component having the interface layer, the metal silicide layer, or both, the WBG semiconductor material is separated from the silicon by less than 100 nanometers at a boundary between the WBG structure and the silicon. In all cases, the microelectronic device is free of interconnect elements, such as interconnect lines, vias, contacts, wire bonds, bump bonds, leads, and such, at a boundary between the WBG structure and the silicon portion of the hybrid component. The microelectronic device has a first current terminal on the silicon portion of the hybrid component, and a second current terminal on the WBG structure of the hybrid component. The first current terminal and the WBG structure are on a same side of the silicon. The WBG structure may include a contact layer between the second current terminal and the WBG semiconductor material, to reduce electrical resistance in the hybrid component. The WBG semiconductor material has at least one lateral dimension adjacent to the silicon that is no greater than 10 times a thickness of the WBG semiconductor material or 10 times a depth of a recess in the silicon in which the WBG semiconductor material is formed, whichever is greater, which may advantageously provide a low number of lattice dislocation defects in the silicon adjacent to the WBG semiconductor material. The thickness of the WBG semiconductor material is in a vertical direction, perpendicular to the lateral dimension.

The microelectronic device may be formed by forming the silicon portion of the hybrid component in the silicon, and subsequently forming the nitride spacer and the WBG structure in a recess on the silicon. The first current terminal and the second current terminal may subsequently be formed on the silicon portion and the WBG structure, respectively. The hybrid component is configured to have current between the first current terminal and the second current terminal pass through the boundary between the WBG structure and the silicon with the nitride spacer directing current to a bottom of the recess which provides more uniform current density between the WBG semiconductor material and the silicon.

It is noted that terms such as top, bottom, front, back, over, above, under, and below may be used in this disclosure. These terms should not be construed as limiting the position or orientation of a structure or element, but should be used to provide spatial relationship between structures or elements. Similarly, words such as "inward" and "outward" would refer to directions toward and away from, respectively, the geometric center of a device or area and designated parts thereof.

For the purposes of this disclosure, the term "lateral" refers to a direction parallel to a plane of the instant top surface of the semiconductor device the term "vertical" is understood to refer to a direction perpendicular to the plane of the instant top surface of the semiconductor device.

For the purposes of this disclosure, the term "conductive" is understood to mean "electrically conductive."

For the purposes of this description, WBG semiconductor material encompasses semiconductor materials having a bandgap energy greater than silicon, including group IV semiconductor materials having a bandgap energy greater than silicon, group III-V semiconductors having a bandgap energy greater than silicon, group II-VI semiconductors having a bandgap energy greater than silicon, perovskite semiconductor material having a bandgap energy greater than silicon, and other semiconductor materials having a bandgap energy greater than silicon, such as magnesium oxide and magnesium sulfide.

Bandgap energy is an energy range in semiconductor material where no electronic states can exist. Bandgap energy generally refers to the energy difference (commonly expressed in electron volts) between a top of a valence band and a bottom of a conduction band in the semiconductor material. Bandgap energy is the energy required to promote a valence electron bound to an atom to become a conduction electron, which is free to move within the semiconductor material and serve as a charge carrier to conduct electric current.

For the purposes of this description, the term "group IV semiconductor material" includes silicon carbide, and alloy group IV semiconductor materials, such as silicon-silicon carbide, or silicon-germanium-silicon carbide, which have a bandgap energy greater than silicon.

Similarly, the term "III-V semiconductor material" is understood to refer to semiconductor material in which group III elements, that is, boron, aluminum, gallium, and indium, provide a portion of the atoms in the III-V semiconductor material, and group V elements, that is, nitrogen, phosphorus, arsenic, and antimony, provide another portion of the atoms in the III-V semiconductor material. Some III-V semiconductor materials may include essentially one element from group III and one element from group V, such as gallium nitride, gallium phosphide, gallium arsenide, and aluminum nitride. Other III-V semiconductor materials, alloy III-V semiconductors, may include two or more elements from group III or two or more elements from group V, such as aluminum gallium nitride and indium aluminum gallium nitride.

Similarly, the term "II-VI semiconductor material" is understood to refer to semiconductor material in which group II elements, such as zinc and cadmium, provide a portion of the atoms in the II-VI semiconductor material, and group VI elements, such as oxygen, sulfur, selenium, and tellurium, provide another portion of the atoms in the II-VI semiconductor material. Some II-VI semiconductor materials may include essentially one element from group II and one element from group VI, such as zinc sulfide, cadmium sulfide, zinc oxide, zinc selenide, and cadmium telluride. Other II-VI semiconductor materials, alloy II-VI semiconductor, may include two or more elements from group II or two or more elements from group VI, such as cadmium zinc telluride.

Compositions of alloy WBG semiconductor materials may be selected to provide at least two or more desired values for the following parameters: bandgap energy, electric field breakdown strength, lattice constant, and epitaxial growth factors such as vapor pressure of precursors and growth temperature. Alloy WBG semiconductor materials may provide more process latitude and higher yield than stoichiometric WBG semiconductor materials.

FIG. 1 is a cross section of an example microelectronic device 100 having a hybrid component with a WBG structure 148 and a WBG gradient semiconductor material 143 between a WBG semiconductor material 144 and silicon semiconductor material 106. The microelectronic device 100 may be manifested as a discrete semiconductor device, an integrated circuit, a micro-electrical mechanical system (MEMS) device, an electro-optical device, or a microfluidic device, by way of example. The hybrid component 102 of this example is described as an LDMOS transistor. Other manifestations of the hybrid component 102 such a DEMOS transistor, a bipolar junction transistor, a junction field effect transistor, and a diode are within the scope of this example.

The microelectronic device 100 includes a substrate 104 that has silicon semiconductor material 106, referred to herein as the silicon 106. The substrate 104 may be, for example, part of a bulk semiconductor wafer, part of a semiconductor wafer with an epitaxial layer, part of a silicon-on-insulator (SOI) wafer, or other structure suitable for forming the microelectronic device 100.

The substrate 104 may include an optional n-type buried layer (NBL) 108 on a base wafer 110. The base wafer 110 may be p-type with a dopant concentration of $1 \times 10^{17}$ atoms/cm$^3$ to $1 \times 10^{18}$ atoms/cm$^3$, for example. Alternatively, the base wafer 110 may be lightly doped, with an average dopant concentration below $1 \times 10^{16}$. The NBL 108 may be 2 microns to 10 microns thick, by way of example, and may have a dopant concentration of $1 \times 10^{16}$ atoms/cm$^3$ to $1 \times 10^{17}$ atoms/cm$^3$. The substrate 104 may include an epitaxial layer 112 of silicon on the NBL 108. The epitaxial layer 112 is part of the silicon 106, and may be 2 microns to 12 microns thick, for example. The epitaxial layer 112 may be p-type, with a dopant concentration of $1 \times 10^{15}$ atoms/cm$^3$ to $1 \times 10^{16}$ atoms/cm$^3$, by way of example. In versions of this example in which the substrate 104 lacks the NBL 108, the epitaxial layer 112 may be directly on the base wafer 110. The substrate 104 may also include an optional blanket p-type buried layer (PBL) 114 in the epitaxial layer 112. The PBL 114 may be 1 micron to 5 microns thick, and may have a dopant concentration of $1 \times 10^{15}$ atoms/cm$^3$ to $3 \times 10^{17}$ atoms/cm$^3$, by way of example.

The microelectronic device 100 of this example includes a field relief dielectric layer 116 at a top surface 118 of the silicon 106, extending from a subsequently-formed gate dielectric layer 124 partway over a subsequently-formed n-type drift region 120. The field relief dielectric layer 116 may have a local oxidation of silicon (LOCOS) structure, with tapered edges, as depicted in FIG. 1, referred to as bird's beaks. Alternatively, the field relief dielectric layer 116 may have a shallow trench isolation (STI) structure in which the field relief dielectric layer 116 is in a trench in the silicon 106.

The hybrid component 102 of this example includes the n-type drift region 120 in the silicon 106. The n-type drift region 120 extends partway under the field relief dielectric layer 116. The n-type drift region 120 may have an average dopant concentration of $4 \times 10^{16}$ atoms/cm$^3$ to $1 \times 10^{18}$ atoms/cm$^3$, by way of example.

The hybrid component 102 of this example may include a patterned PBL 122 in the epitaxial layer 112, under a subsequently-formed p-type body well 128. In this example, the patterned PBL 122 may be located from 1 micron to 3 microns below the top surface 118 of the silicon 106, and may have a thickness of 2 microns to 5 microns, by way of example. The patterned PBL 122 may have an average dopant concentration of $5 \times 10^{15}$ atoms/cm$^3$ to $2 \times 10^{16}$ atoms/cm$^3$, by way of example.

The hybrid component 102 of this example includes a gate dielectric layer 124 on the top surface 118 of the silicon 106, extending from the field relief dielectric layer 116 partway over subsequently-formed p-type body well 128. The gate dielectric layer 124 may be 1.5 nanometers to 30 nanometers thick, by way of example. The gate dielectric layer 124 may include primarily silicon dioxide, and may include 5 atomic percent to 10 atomic percent nitrogen atoms to improve reliability. The gate dielectric layer 124 may also include high-k dielectric material, such as hafnium oxide or zirconium oxide. The gate dielectric layer 124 may have a thickness appropriate for an operating voltage of the hybrid component 102.

The hybrid component 102 of this example includes a gate electrode 126 on the gate dielectric layer 124 and extending partway over the field relief dielectric layer 116. The gate electrode 126 may include polycrystalline silicon, commonly referred to as polysilicon, with n-type dopants such as phosphorus, arsenic, and antimony. Alternatively, the gate electrode 126 may include metal silicide extending down to the gate dielectric layer 124, in a gate architecture referred to as a fully silicided (FUSI) gate. In a further option, the gate electrode 126 may include one or more metals such as titanium, titanium nitride, tantalum, or tantalum nitride. The gate electrode 126 may be 100 nanometers to 500 nanometers thick, by way of example.

The hybrid component 102 of this example includes the p-type body well 128 in the silicon 106. The p-type body well 128 extends partway under the gate electrode 126, proximate to the n-type drift region 120. The p-type body well 128 may extend to a depth of 1 micron to 3 microns, for example, and may optionally abut a top portion of the patterned PBL 122. The p-type body well 128 may have a dopant concentration of $5\times10^{17}$ atoms/cm$^3$ to $5\times10^{18}$ atoms/cm$^3$, by way of example. The dopant concentration in the p-type body well 128 at the top surface 118 of the silicon 106 under the gate dielectric layer 124 affects a threshold potential of the hybrid component 102 of this example.

The hybrid component 102 of this example further includes a shallow n-type well 130 in the silicon 106, surrounded by the p-type body well 128. The shallow n-type well 130 extends in the silicon 106 proximate to an edge of the gate electrode 126, opposite from the n-type drift region 120. The shallow n-type well 130 may have a dopant concentration of $1\times10^{19}$ atoms/cm$^3$ to $5\times10^{19}$ atoms/cm$^3$, by way of example.

The hybrid component 102 of this example may include sidewall spacers 132 on lateral surfaces of the gate electrode 126. In this context, lateral surfaces are sides of the gate electrode 126 that are generally perpendicular to the top surface 118 of the silicon 106 under the gate electrode 126. The sidewall spacers 132 include dielectric material, such as silicon dioxide and silicon nitride. The sidewall spacers 132 may extend 100 nanometers to 500 nanometers from the lateral surfaces of the gate electrode 126.

The hybrid component 102 of this example includes an n-type source contact region 134 in the silicon 106, adjacent to the sidewall spacers 132, opposite from the n-type drift region 120. The n-type source contact region 134 may partially overlap the shallow n-type well 130. The n-type source contact region 134 may have a dopant concentration of $5\times10^{19}$ atoms/cm$^3$ to $5\times10^{20}$ atoms/cm$^3$, by way of example.

The hybrid component 102 of this example includes metal silicide 136 on the silicon 106 on the n-type source contact region 134, and on the n-type drift region 120. The hybrid component 102 may further include the metal silicide 136 on the gate electrode 126 in versions of this example in which the gate electrode 126 includes polysilicon. The metal silicide 136 includes silicon and a metal, such as platinum, tungsten, titanium, cobalt, nickel, chromium, or molybdenum. The metal silicide 136 may be 10 nanometers to 50 nanometers thick, by way of example.

The hybrid component 102 of this example includes a pre-metal dielectric (PMD) liner 138 formed over the microelectronic device 100. The PMD liner 138 may include one or more layers of silicon nitride, silicon dioxide, or silicon oxynitride. The PMD liner 138 may be 10 nanometers to 100 nanometers thick, for example.

The microelectronic device 100 includes a PMD layer 142 over the PMD liner 138. The PMD layer 142 is electrically non-conductive, and may include one or more sublayers of dielectric material. By way of example, the PMD layer 142 may include a planarized layer of silicon dioxide, phosphosilicate glass (PSG), fluorinated silicate glass (FSG), or borophosphosilicate glass (BPSG), on the PMD liner 138. The PMD layer 142 may further include a PMD cap layer, not explicitly shown, of silicon nitride, silicon carbide, or silicon carbonitride, suitable for an etch-stop layer of a metal CMP stop layer, on the planarized layer. Other layer structures and compositions for the PMD layer 142 are within the scope of this example.

The hybrid component 102 includes a silicon recess nitride spacer 145 and a WBG gradient semiconductor material 143 within a silicon recess 146 in the n-type drift region 120. The silicon recess nitride spacer 145 includes dielectric nitride selected from the group consisting of silicon nitride, boron nitride, aluminum nitride or other dielectric nitride material. The silicon recess nitride spacer 145 directs current to a bottom of the silicon recess 146 and provides more uniform current density between the WBG semiconductor material 144 and the silicon 106. The WBG gradient semiconductor material 143 minimizes the lattice mis-match between the silicon in the n-type drift region 120 and the WBG semiconductor material 144 which is deposited on top of the WBG gradient semiconductor material 143. The WBG gradient semiconductor material 143 has a first lattice constant, and the WBG semiconductor material 144 has a second lattice constant wherein the lattice constant of the WBG gradient semiconductor material 143 is between the lattice constant of silicon 106 and the lattice constant of the WBG semiconductor material 144. The WBG semiconductor material 144 extends from the WBG gradient semiconductor material 143 and may extend into the PMD layer 142. The WBG gradient semiconductor material 143 may include a uniform composition, or may include sublayers of varying composition. The WBG semiconductor material 144 may include a uniform composition, or may include sublayers with varying composition. The WBG gradient semiconductor material 143 may include any of the WBG semiconductor materials disclosed herein. The WBG semiconductor material 144 may include any of the WBG semiconductor materials disclosed herein. The WBG gradient semiconductor material 143 and the WBG semiconductor material 144 in the silicon recess 146 of the n-type drift region 120 provide a WBG structure 148 of the hybrid component 102. The WBG structure 148 has a lateral dimension adjacent to the silicon 106 that is no greater than 10 times a thickness of the WBG structure 148 in at least one lateral direction. In this context, lateral refers to a direction parallel to a planar portion of the top surface 118 of the silicon 106.

Additional dielectric material may be formed over the WBG structure 148 as part of the PMD layer 142, to provide a planar top surface of the PMD layer 142, as indicated in FIG. 1. Having the top surface of the PMD layer 142 to be planar may facilitate formation of an electrical connection to a top of the WBG structure 148.

The microelectronic device 100 includes contacts 150 through the PMD layer 142 and the PMD liner 138, onto the metal silicide 136 on the n-type source contact region 134, on the gate electrode 126, and on the WBG structure 148. The contacts 150 are conductive, and provide electrical connections to the n-type source contact region 134, and the WBG structure 148.

The contacts 150 may include a titanium adhesion layer, not explicitly shown, contacting the PMD layer 142, the n-type source contact region 134, and the WBG structure 148, with a titanium nitride diffusion barrier, not explicitly shown, on the titanium adhesion layer, and a tungsten core, not explicitly shown, on the titanium nitride diffusion barrier. Alternatively, the contacts 150 may have a uniform composition of tungsten. Other compositions and structures for the contacts 150 are within the scope of this example.

The microelectronic device 100 includes interconnects 156 on the contacts 150. In some versions of this example at least one of the interconnects 156 is part of an electrical connection to the n-type source contact region 134 through one or more contacts 150. Another of the interconnects 156 provides an electrical connection to the WBG structure 148 through one or more of the contacts 150. In some versions of this example, one or more of the interconnects 156a may optionally connect the n-type source contact region 134 to the gate electrode 126, so that the hybrid component 102 is manifested as a gated diode rather than the LDMOS transistor. The interconnects 156 are conductive. In one version of this example, the interconnects 156 may have an etched aluminum structure, and may include an adhesion layer, not explicitly shown, of titanium nitride or titanium tungsten, on the PMD layer 142, an aluminum layer with a few atomic percent of silicon, titanium, or copper, on the adhesion layer, and an anti-reflection layer, not explicitly shown, of titanium nitride on the aluminum layer. In another version of this example, the interconnects 156 may have a damascene structure, and may include a barrier liner of tantalum and tantalum nitride, or a barrier liner of cobalt, in an interconnect trench in an intra-metal dielectric (IMD) layer 182 on the PMD layer 142, with a copper fill metal in the interconnect trench on the barrier liner. In further version of this example, the interconnects 156 may have a plated structure, and may include an adhesion layer, not explicitly shown, on the PMD layer 142 and the contacts 150, with interconnects 156 of copper on the adhesion layer. In yet another version, the interconnects 156 may include primarily cobalt. Other structures and compositions for the interconnects 156 are within the scope of this example.

A combination of at least the n-type source contact region 134, the shallow n-type well 130, the p-type body well 128, and the n-type drift region 120 provide a silicon portion 158 of the hybrid component 102. The metal silicide 136 on the n-type source contact region 134 combined with the contacts 150 on the metal silicide 136 on the n-type source contact region 134 provides a first current terminal 152 of the hybrid component 102. The first current terminal 152 is on the silicon portion 158 of the hybrid component 102. The contacts 150 on the WBG structure 148 provides a second current terminal 154 of the hybrid component 102. The hybrid component 102 is configured to have current flow between the first current terminal 152 and the second current terminal 154, directly between the silicon portion 158 and the WBG structure 148.

During operation of the microelectronic device 100, the gate electrode 126 may be biased above threshold, so that the hybrid component 102 is in an on state, in which case current may flow between the first current terminal 152 and the second current terminal 154, through the silicon portion 158 and the WBG structure 148. Furthermore, during operation of the microelectronic device 100, the gate electrode 126 may be biased below threshold, so that the hybrid component 102 is in an off state. While the hybrid component 102 is in the off state, the second current terminal 154 of the hybrid component 102 may be biased at a high potential, for example, 30 volts to 1000 volts, with respect to the first current terminal 152. The WBG structure 148 may be depleted and thereby accommodate a significant portion of the potential difference between the second current terminal 154 and the first current terminal 152, so that the silicon 106 in the n-type drift region 120 does not break down. The hybrid component 102 may advantageously have a smaller area compared to an all-silicon component operating at the same potential difference with the silicon recess nitride spacer 145 directing current to a bottom of the silicon recess 146 and providing more uniform current density between the WBG semiconductor material 144 through the gradient semiconductor material 143 to the silicon 106. In one version of this example, the hybrid component 102 of this example may advantageously provide a normally-off switch capable of handling operating potential of 30 volts to 1000 volts in a smaller package than multi-chip modules having a discrete depletion-mode gallium nitride transistor and an enhancement mode silicon transistor. In another version of this example, in which the substrate 104 is an SOI substrate, the WBG structure 148 may include a light-emitting diode (LED) structure, thus advantageously providing an area-efficient and low cost integration for a micro-LED display.

Figure 2:
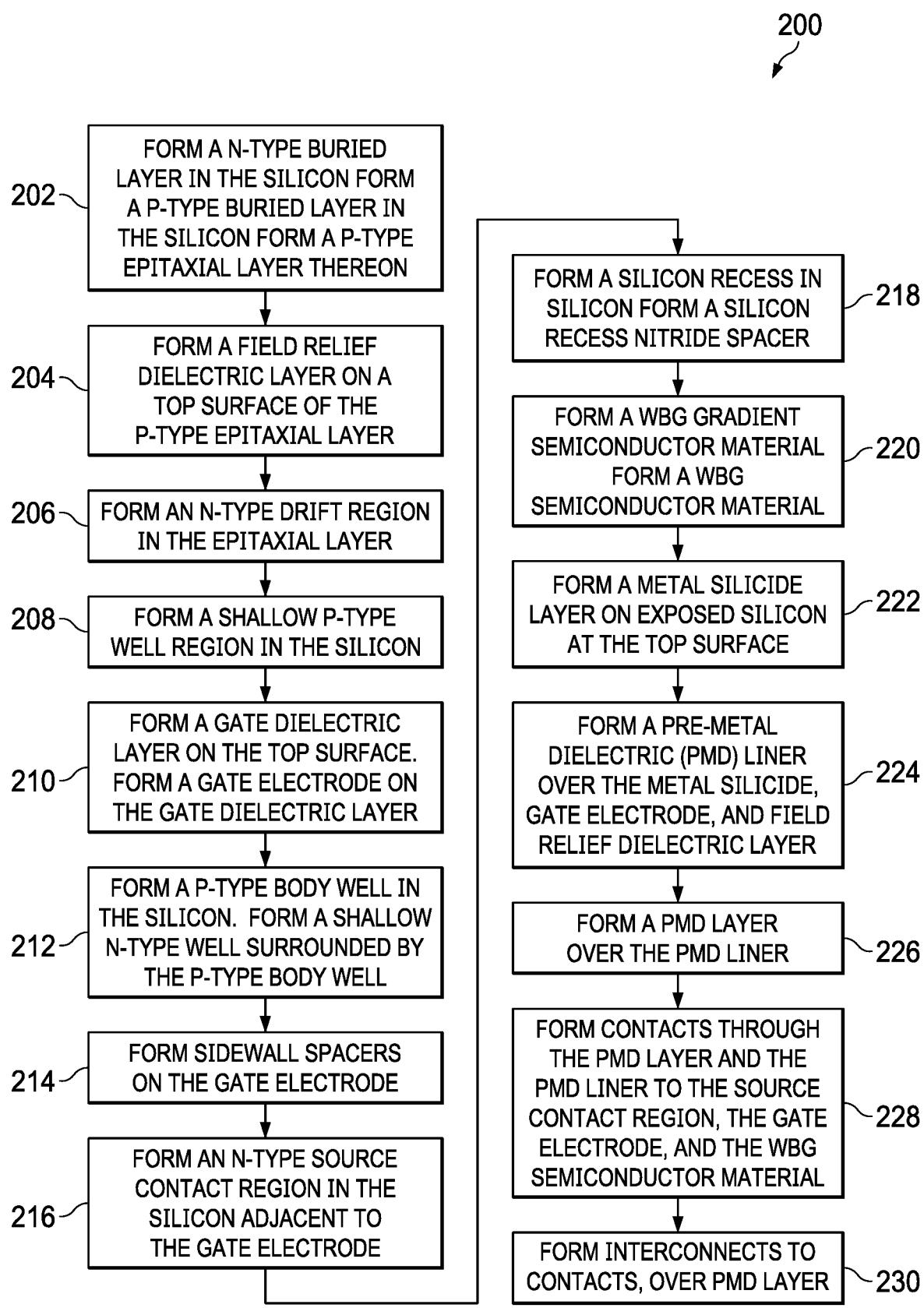
FIG. 2 presents a flowchart of an example method of forming the microelectronic device of FIG. 1.

FIG. 2 presents a flowchart of an example method 200 of forming the microelectronic device 100 of FIG. 1. Structural elements referred to in the steps of the method 200 are shown in FIG. 1. The method 200 includes step 202, which may include optionally forming the NBL 108 on the base wafer 110. The NBL 108 may be formed by forming a hard mask, not explicitly shown, over the base wafer 110 that exposes the base wafer 110 in an area for the NBL 108. N-type dopants, such as antimony and optionally some arsenic, are implanted into the base wafer 110 at a dose of $5 \times 10^{14}$ ions/cm$^2$ to $3 \times 10^{15}$ ions/cm$^2$, where exposed by the hard mask. The substrate 104 is heated to diffuse and activate the implanted n-type dopants to form the NBL 108.

Step 202 may include optionally forming the PBL 114 in the silicon 106. The PBL 114 may be formed by implanting boron into the silicon 106 at a dose of $1 \times 10^{14}$ ions/cm$^2$ to $1 \times 10^{15}$ ions/cm$^2$, followed by heating the substrate 104 to activate the implanted boron.

Step 202 includes forming the epitaxial layer 112 on the NBL 108. The epitaxial layer 112 may be formed by an epitaxial process after the NBL 108 is formed. The n-type dopants of the NBL 108 and the p-type dopants of the PBL 114 may diffuse into the epitaxial layer 112 during the epitaxial process. In versions of this example in which the substrate 104 lacks the NBL 108 or the PBL 114, the epitaxial layer 112 may be formed on the base wafer 110.

The method 200 continues with step 204, which includes forming the field relief dielectric layer 116 at the top surface 118 of the silicon 106. The field relief dielectric layer 116 may be formed by a LOCOS process, which includes forming a layer of thermal oxide at the top surface 118, and forming a patterned layer of silicon nitride on the thermal oxide. The field relief dielectric layer 116 is formed by thermal oxidation in areas exposed by the patterned layer of silicon nitride. The patterned layer of silicon nitride is subsequently removed. Alternatively, the field relief dielectric layer 116 may be formed by an STI process, which includes forming a trench in the silicon 106, and filling the trench with silicon dioxide by a sequence of thermal oxidation and chemical vapor deposition (CVD) processes. The silicon dioxide is removed outside the trench by a chemical mechanical polish (CMP) process.

The method 200 continues with step 206, which includes forming the n-type drift region 120 in the silicon 106. The n-type drift region 120 may be formed by forming an implant mask, not explicitly shown, over the top surface 118 that exposes the epitaxial layer 112 in an area for the n-type drift region 120, and implanting n-type dopants, such as phosphorus, into the silicon 106 where exposed by the implant mask. The n-type dopants for the n-type drift region 120 may be implanted in multiple steps at a total dose of $4 \times 10^{12}$ ions/cm$^2$ to $1 \times 10^{13}$ ions/cm$^2$. Subsequently, the substrate 104 is heated to diffuse and activate the implanted n-type dopants.

The method 200 continues with step 208, which includes forming the patterned PBL 122 in the epitaxial layer 112. The patterned PBL 122 may be formed by forming an implant mask, not explicitly shown, over the top surface 118 that exposes the epitaxial layer 112 in an area for the patterned PBL 122, and implanting boron, into the silicon 106 where exposed by the implant mask. The boron for the patterned PBL 122 may be implanted with an energy of 1000 kilo-electron volts (keV) to 1500 keV, at a total dose of $2 \times 10^{12}$ ions/cm$^2$ to $5 \times 10^{12}$ ions/cm$^2$. Subsequently, the substrate 104 is heated to diffuse and activate the implanted boron.

The method 200 continues with step 210, which includes forming the gate dielectric layer 124 on the top surface 118 of the silicon 106. Silicon dioxide in the gate dielectric layer 124 may be formed by thermal oxidation in an ambient containing oxygen and nitrogen. Nitrogen may be introduced into the gate dielectric layer 124 by exposure to nitrogen radicals in a decoupled plasma nitridation process or a remote plasma nitridation process, followed by an anneal process. High-k dielectric material, such as hafnium oxide or zirconium oxide, may be formed in the gate dielectric layer 124 by a sputter process, an atomic layer deposition (ALD) process, or a metalorganic chemical vapor deposition (MOCVD) process.

Step 210 further includes forming the gate electrode 126 on the gate dielectric layer 124. Polysilicon in the gate electrode 126 may be formed by a plasma-enhanced chemical vapor deposition (PECVD) process using silane or disilane, followed by a reactive ion etch (RIE) process using an etch mask. A FUSI version of the gate electrode 126 may be formed by forming polysilicon on the gate dielectric layer 124, patterning the polysilicon, and forming a layer of metal such as titanium on the polysilicon. The layer of metal and the polysilicon are heated to form metal silicide that extends to the gate dielectric layer 124. A metal version of the gate electrode 126 may be formed by a metal replacement gate process, in which patterned polysilicon is surrounded by dielectric material and removed by etching to form a gate cavity, exposing the gate dielectric layer 124. The one or more metals are formed on the gate dielectric layer 124 in the gate cavity.

The method 200 continues with step 212 which includes forming the p-type body well 128 in the silicon 106 adjacent to the gate electrode 126, opposite from the n-type drift region 120, and forming the shallow n-type well 130 in the p-type body well 128. The p-type body well 128 and the shallow n-type well 130 may be formed using an implant mask, not explicitly shown, and implanting boron for the p-type body well 128 and implanting arsenic or antimony for the shallow n-type well 130 into the epitaxial layer 112 where exposed by the implant mask. The boron may be implanted at a dose of $8 \times 10^{13}$ ions/cm$^2$ to $3 \times 10^{14}$ ions/cm$^2$, by way of example. The arsenic or antimony may be implanted at a dose of $1 \times 10^{14}$ ions/cm$^2$ to $5 \times 10^{14}$ ions/cm$^2$, by way of example. After the boron and arsenic or antimony are implanted, the substrate 104 is heated to diffuse and activate the implanted boron and arsenic or antimony. In another version of this example, the p-type body well 128 and the shallow n-type well 130 may be formed before forming the gate electrode 126.

The method 200 continues with step 214, which includes forming the sidewall spacers 132 on the gate electrode 126. The sidewall spacers 132 may be formed by forming one or more conformal layers of dielectric material over the gate electrode 126. The dielectric material is subsequently removed from horizontal surfaces, that is, surfaces generally parallel to the top surface 118 of the silicon 106, by an anisotropic etch process such as an RIE process, leaving the dielectric material on the lateral surfaces of the gate electrode 126. The method 200 continues with step 216, which includes forming the n-type source contact region 134 in the silicon 106. The n-type source contact region 134 may be formed using an implant mask, not explicitly shown, which exposes the silicon 106 in an area for the n-type source contact region 134. N-type dopants, such as phosphorus and arsenic, are implanted into the silicon 106 where exposed by the implant mask. The phosphorus and arsenic may be implanted at a total dose of $1 \times 10^{15}$ ions/cm$^2$ to $1 \times 10^{16}$ ions/cm$^2$, by way of example. After the phosphorus and arsenic are implanted, the substrate 104 is heated, for example by a rapid thermal process (RTP) tool, to activate the implanted phosphorus and arsenic.

The method 200 continues with step 218, which includes forming the silicon recess 146 in the n-type drift region 120 of the silicon 106 and the forming of the silicon recess nitride spacer 145. The silicon recess 146 is initially defined using either a photoresist mask or a hard mask process, not specifically shown. The hard mask layer may be a hard mask layer of silicon nitride, another nitride layer. The silicon recess 146 is formed using either a plasma etch process or a wet etch process on the silicon 106 exposed by the hard mask. The silicon recess nitride spacer 145 may be formed by depositing one more conformal layers of nitride material over the silicon recess 146. The nitride layer is subsequently removed from horizontal surfaces, that is, surfaces generally parallel to the top surface 118 of the silicon 106, by an anisotropic etch process such as an RIE process, leaving the dielectric material on the lateral surfaces of the silicon recess 146. The upper edges of the silicon recess nitride spacer 145 may protrude above the top surface 118 of the silicon 106.

The method 200 continues with step 220, which includes forming the WBG gradient semiconductor material 143 and the formation of the WBG semiconductor material 144. A faceting etch process, not specifically shown, may be used to optimize the profile of the silicon recess 146 before the formation of the WBG gradient semiconductor material 143. The WBG gradient semiconductor material 143 may be formed as a blanket film on the silicon 106. After formation of the WBG gradient semiconductor material 143, the WBG semiconductor material 144 is formed. The WBG semiconductor material 144 may be formed as a blanket film. After the formation of the WBG gradient semiconductor material 143 and the WBG semiconductor material 144, a photolithography step and a wet etch or plasma etch process may be used to remove WBG semiconductor material 144 and WBG gradient semiconductor material 143 from areas outside of the silicon recess 146, such that WBG gradient semiconductor material 143 and WBG semiconductor material 144 remain in the silicon recess 146 region. The top of the WBG structure 148 may be above or below the surface 118 of the silicon. Alternatively, a hard mask, not specifically shown, may be used to mask areas outside of the silicon recess 146 and a selective deposition process may be used to form the WBG gradient semiconductor material 143 in the silicon recess 146. A faceting etch process, not specifically shown, may be used to optimize the profile of the silicon recess 146 before the formation of the WBG gradient semiconductor material 143. After formation of the WBG gradient semiconductor material 143 in the silicon recess 146, a second selective deposition process may be used to form the WBG semiconductor material 144 on the WBG gradient semiconductor material 143. After the formation of the WBG gradient semiconductor material 143 and the WBG semiconductor material 144, the hard mask is removed. A sacrificial silicon nitride layer may be used to cover the WBG semiconductor material 144 during the metal silicide 136 formation process. The WBG semiconductor material 144 can either be formed as an epitaxial layer or a polycrystalline layer. If the WBG semiconductor material 144 is formed as a polycrystalline layer, a recrystallization step using a thermal anneal may be used to enhance the crystal structure of the WBG semiconductor material 144. The WBG semiconductor material 144 has a lateral dimension adjacent to the silicon 106 that is no greater than 10 times a thickness of the WBG semiconductor material 144 or 10 times a depth of the silicon recess 146, whichever is greater, in at least one lateral direction which may advantageously facilitate forming the WBG semiconductor material 144 in a monocrystalline state, due to limited buildup of lattice mismatch over the lateral dimension.

The method 200 continues with step 222, which includes forming the metal silicide 136 on the silicon 106, and optionally on polysilicon in the gate electrode 126. The metal silicide 136 may be formed by forming a layer of metal on the microelectronic device 100 at the top surface 118, contacting the silicon 106 and contacting the gate electrode 126. The layer of metal may include platinum, tungsten, titanium, cobalt, nickel, chromium, or molybdenum, by way of example. A cap layer of titanium nitride or tantalum nitride may be formed over the layer of metal. Subsequently, the microelectronic device 100 is heated to react the layer of metal with the silicon 106, and the polysilicon, to form the metal silicide 136. Unreacted metal is removed from the microelectronic device 100, leaving the metal silicide 136 in place. The unreacted metal may be removed by a wet etch process using an aqueous mixture of sulfuric acid and hydrogen peroxide, or an aqueous mixture of nitric acid and hydrochloric acid, by way of example. The metal silicide 136 may provide electrical connections to the n-type source contact region 134, the n-type drift region 120, and the gate electrode 126 with lower resistances compared to a similar microelectronic device without metal silicide.

The method 200 continues with step 224, which includes forming the PMD liner 138 over the microelectronic device 100. The PMD liner 138 may be formed in one or more sublayers of by one or more CVD processes. The PMD liner 138 is non-conducting. A silicon nitride sublayer may be formed by a low pressure chemical vapor deposition (LPCVD) process using dichlorosilane and ammonia, or by a PECVD process using bis(tertiary-butyl-amino)silane (BTBAS). A silicon dioxide sublayer may be formed by a PECVD process using tetraethyl orthosilicate (TEOS), formally named tetraethoxysilane. A silicon oxynitride sublayer may be formed by a PECVD process using BTBAS and TEOS.

The method 200 continues with step 226, which includes forming the PMD layer 142 over the PMD liner 138. The PMD layer 142 may be formed by one or more dielectric deposition processes, including a PECVD process using TEOS, a high density plasma (HDP) process, or a high aspect ratio process (HARP) using TEOS and ozone, by way of example. The PMD layer 142 may be planarized by an oxide CMP process.

The method 200 continues with step 228, which includes forming the contacts 150 through the PMD layer 142 and the PMD liner 138. The contacts 150 may be formed by etching contact holes through the PMD layer 142 and the PMD liner 138 to expose the metal silicide 136, and the WBG structure 148. In one version of step 226, the contacts 150 may be formed by sputtering titanium to form a titanium adhesion layer, followed by forming the titanium nitride diffusion barrier using reactive sputtering or an ALD process. The tungsten core may be formed by an MOCVD process using tungsten hexafluoride ($WF_6$) reduced by silane initially and hydrogen after a layer of tungsten is formed on the titanium nitride diffusion barrier. The tungsten, titanium nitride, and titanium is subsequently removed from a top surface of the PMD layer 142 by an etch process, a tungsten CMP process, or a combination of both, leaving the contacts 150 extending to the top surface of the PMD layer 142. In another version of step 228, the contacts 150 may be formed by a selective tungsten deposition process which fills the contact holes with tungsten from the bottom up, forming the contacts 150 with a uniform composition of tungsten. Other methods of forming the contacts 150 are within the scope of this step 228.

The method 200 continues with step 230, which includes forming the interconnects 156 on the contacts 150. In versions of this example in which the interconnects 156 have an etched aluminum structure, the interconnects 156 may be formed by depositing the adhesion layer, the aluminum layer, and the anti-reflection layer, and forming an etch mask, not explicitly shown, followed by an RIE process to etch the anti-reflection layer, the aluminum layer, and the adhesion layer where exposed by the etch mask, and subsequently removing the etch mask.

In versions of this example in which the interconnects 156 have a damascene structure, the interconnects 156 may be formed by forming the IMD layer 182 on the PMD layer 142, and etching the interconnect trenches through the IMD layer 182 to expose the contacts 150. The barrier liner may be formed by sputtering tantalum onto the IMD layer 182 and the PMD layer 142 which is exposed and contacts 150, and forming tantalum nitride on the sputtered tantalum by an ALD process. The copper fill metal may be formed by sputtering a seed layer, not explicitly shown, of copper on the barrier liner, and electroplating copper on the seed layer to fill the interconnect trenches. Copper and barrier liner metal is subsequently removed from a top surface of the IMD layer 182 by a copper CMP process.

In versions of this example in which the interconnects 156 have a plated structure, the interconnects 156 may be formed by sputtering the adhesion layer, containing titanium, on the PMD layer 142 and contacts 150, followed by sputtering a seed layer, not explicitly shown, of copper on the adhesion layer. A plating mask is formed on the seed layer that exposes areas for the interconnects 156. The interconnects 156 are formed by electroplating copper on the seed layer where exposed by the plating mask. The plating mask is removed, and the seed layer and the adhesion layer are removed by wet etching between the interconnects 156.

Figure 3:
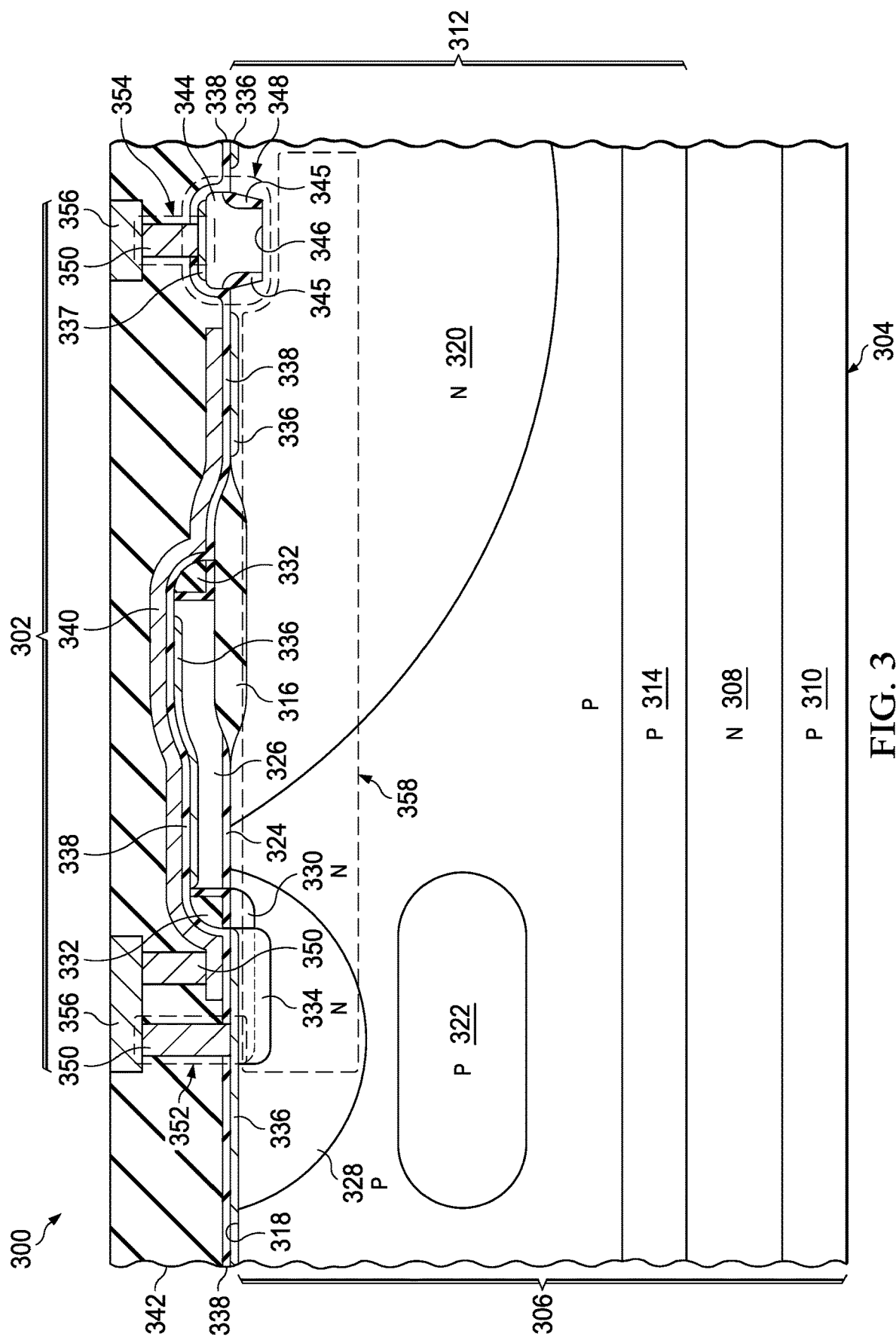
FIG. 3 is a cross section of an example microelectronic device having a hybrid component with a WBG structure and a WBG contact layer between the WBG semiconductor material and the contacts of the second current terminal.

FIG. 3 is a cross section of an example microelectronic device 300 having a hybrid component 302 with a WBG structure 348 and a WBG contact layer 337 between a WBG semiconductor material 344 and contacts 350 of the second current terminal 354. The microelectronic device 300 may be manifested as any of the device types disclosed in reference to the microelectronic device 100 of FIG. 1. The hybrid component 302 of this example is described as an LDMOS transistor with a source tied field plate. Other manifestations of the hybrid component 302 are within the scope of this example. The microelectronic device 300 includes a substrate 304 that has silicon semiconductor material 306, referred to herein as the silicon 306. The substrate 304 may be manifested as any of the substrate types disclosed in reference to the substrate 104 of FIG. 1.

The substrate 304 may include an optional NBL 308 on a base wafer 310. The substrate 304 may include an epitaxial layer 312 of silicon on the NBL 308. In versions of this example in which the substrate 304 lacks the NBL 308, the epitaxial layer 312 may be directly on the base wafer 310. The substrate 304 may also include an optional blanket PBL 314 in the epitaxial layer 312. The optional NBL 308, the base wafer 310, the epitaxial layer 312, and the optional blanket PBL 314 may have the dimensions and dopant concentrations disclosed in reference to the NBL 108, the base wafer 110, the epitaxial layer 112, and the PBL 114 of FIG. 1.

The microelectronic device 300 of this example includes a field relief dielectric layer 316 at a top surface 318 of the silicon 306, extending from a subsequently-formed gate dielectric layer 324 partway over a subsequently-formed n-type drift region 320. The field relief dielectric layer 316 may have the structure and composition disclosed in reference to the field relief dielectric layer 116 of FIG. 1.

The hybrid component 302 of this example includes the n-type drift region 320 in the silicon 306, extending partway under the field relief dielectric layer 316. The hybrid component 302 of this example may include a patterned PBL 322 in the epitaxial layer 312, under a subsequently-formed p-type body well 328. The hybrid component 302 of this example includes a gate dielectric layer 324 on the top surface 318 of the silicon 306, extending from the field relief dielectric layer 316 partway over subsequently-formed p-type body well 328. The hybrid component 302 of this example includes a gate electrode 326 on the gate dielectric layer 324 and extending partway over the field relief dielectric layer 316. The hybrid component 302 of this example includes the p-type body well 328 in the silicon 306. The p-type body well 328 extends partway under the gate electrode 326, proximate to the n-type drift region 320. The hybrid component 302 of this example further includes a shallow n-type well 330 in the silicon 306, surrounded by the p-type body well 328, extending in the silicon 306 proximate to an edge of the gate electrode 326, opposite from the n-type drift region 320. The hybrid component 302 of this example may include sidewall spacers 332 on lateral surfaces of the gate electrode 326. The hybrid component 302 of this example includes an n-type source contact region 334 in the silicon 306, adjacent to the sidewall spacers 332, opposite from the n-type drift region 320. The n-type drift region 320, the patterned PBL 322, the gate dielectric layer 324, the gate electrode 326, the p-type body well 328, the shallow n-type well 330, the sidewall spacers 332, and the n-type source contact region 334 may have the properties, dimensions, compositions, and dopant concentrations disclosed in reference to the corresponding elements of FIG. 1.

The hybrid component 302 includes a silicon recess nitride spacer 345 and a WBG semiconductor material 344 within a silicon recess 346 in the n-type drift region 320. The silicon recess nitride spacer 345 directs current to a bottom of the silicon recess 346 and provides more uniform current density between the WBG semiconductor material 344 and the silicon 306. The WBG semiconductor material 344 extends from the silicon recess 346 and may extend into the PMD layer 342. The WBG structure 348 has a lateral dimension adjacent to the silicon 306 that is no greater than 10 times a thickness of the WBG structure 348 or 10 times a depth of the silicon recess 346, whichever is greater, in at least one lateral direction. The WBG semiconductor material 344 may include a uniform composition, or may include sublayers with varying composition. The WBG semiconductor material 344 may include any of the WBG semiconductor materials disclosed herein. The WBG semiconductor material 344 may include a WBG contact layer 337 on the WBG semiconductor material 344. The WBG contact layer 337 can be a metal such as titanium, tungsten silicide, or similar material. The WBG semiconductor material 344 in the silicon recess 346 and the WBG contact layer 337 provide a WBG structure 348 of the hybrid component 102. The WBG semiconductor material 344 may be deposited as a WBG polycrystalline material and recrystallized in a subsequent thermal anneal.

The hybrid component 302 of this example may include metal silicide 336 on the silicon 306 on the n-type source contact region 334. The hybrid component 302 may further include the metal silicide 336 on the gate electrode 326 and the n-type drift region 320. The metal silicide 336 may have any of the compositions disclosed in reference to the metal silicide 136 of FIG. 1.

The hybrid component 302 of this example includes a source-connected field plate 340 over the PMD liner 338. The source-connected field plate 340 extends over the gate electrode 326 and partway over the n-type drift region 320. The hybrid component 302 may optionally include a field plate isolation layer of dielectric material between the source-connected field plate 340 and the PMD liner 338, to enable the n-type drift region 320 to be biased to a higher potential during operation of the microelectronic device 300. The source-connected field plate 340 may include metal, polysilicon, or other conductive material. The source-connected field plate 340 is electrically connected to the n-type source contact region 334.

The microelectronic device 300 includes a PMD liner 338 formed over the substrate 304. The PMD liner 338 may have the structure and composition disclosed in reference to the PMD liner 138 of FIG. 1.

The microelectronic device 300 includes a PMD layer 342 over the PMD liner 338 and source-connected field plate 340. The PMD layer 342 is electrically non-conductive, and may include one or more sublayers of dielectric material, such as the materials disclosed in reference to the PMD layer 142 of FIG. 1.

The microelectronic device 300 includes contacts 350 through the PMD layer 342 and the PMD liner 338. The contacts 350 are conductive, and provide electrical connections to the metal silicide 336 on the n-type source contact region 334, the gate electrode 326 (out of the plane of the cross section in FIG. 3) and the WBG contact layer 337. The contacts 350 may have any of the structures and compositions disclosed in reference to the contacts 150 of FIG. 1. Other compositions and structures for the contacts 350 are within the scope of this example.

The microelectronic device 300 includes interconnects 356 on the contacts 350. The interconnects 356 are conductive. At least one of the interconnects 356 provides an electrical connection to the n-type source contact region 334 through one or more of the contacts 350. Another of the interconnects 356 provides an electrical connection to the WBG contact layer 337 through one or more of the contacts 350. Another of the interconnects 356 provides an electrical connection to the gate electrode 326 (out of the plane of FIG. 3). Another of the contacts 350 provides an electrical connection to the source-connected field plate 340. The interconnects 356 may have any of the structures and compositions disclosed in reference to the interconnects 156 of FIG. 1. Other compositions and structures for the contacts 350 and the interconnects 356 are within the scope of this example.

A combination of at least the n-type source contact region 334, the shallow n-type well 330, the p-type body well 328, and the n-type drift region 320 provide a silicon portion 358 of the hybrid component 302. The metal silicide 336 on the n-type source contact region 334 combined with the contacts 350 on the metal silicide 336 on the n-type source contact region 334 provides a first current terminal 352 of the hybrid component 302. The first current terminal 352 is on the silicon portion 358 of the hybrid component 302. The contacts 350 on the WBG structure 348 provides a second current terminal 354 of the hybrid component 302. Operation of the hybrid component 302 may be similar to the operational details disclosed in reference to the hybrid component 102 of FIG. 1.

Figure 4:
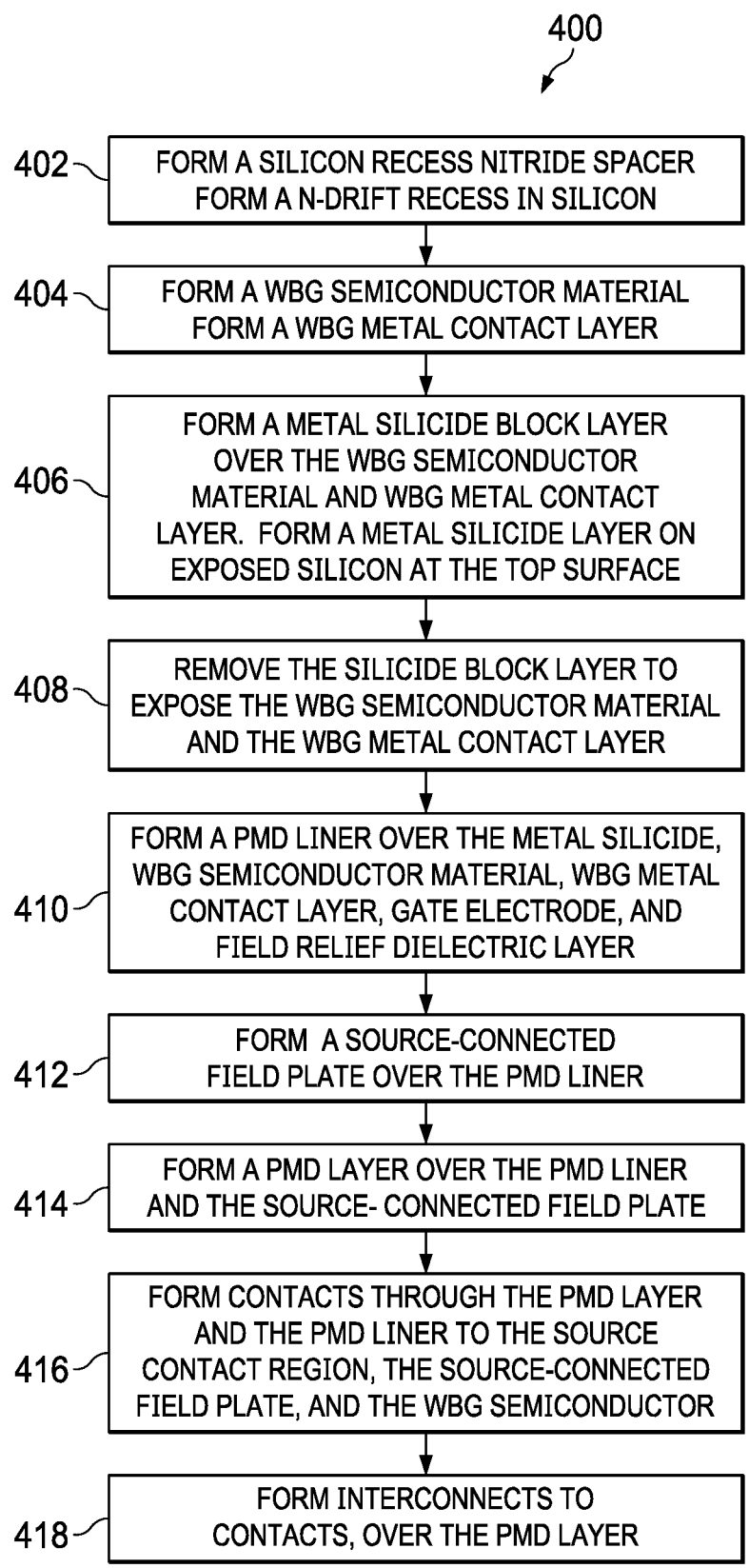
FIG. 4 presents a flowchart of an example method of forming the microelectronic device of FIG. 3.

FIG. 4 presents a flowchart of an example method 400 of forming the microelectronic device 300 of FIG. 3. Structural elements referred to in the steps of the method 400 are shown in FIG. 3. Fabrication of the microelectronic device 300 includes optionally forming the NBL 308 on the base wafer 310, optionally forming the PBL 314 in the silicon 306, forming the epitaxial layer 312 on the NBL 308, forming the field relief dielectric layer 316 at the top surface 318 of the silicon 306, forming the n-type drift region 320 in the silicon 306, forming the patterned PBL 322 in the epitaxial layer 312, forming the gate dielectric layer 324 on the top surface 318 of the silicon 306, forming the gate electrode 326 on the gate dielectric layer 324, forming the p-type body well 328 in the silicon 306 adjacent to the gate electrode 326, opposite from the n-type drift region 320, and forming the shallow n-type well 330 in the p-type body well 328, forming the sidewall spacers 332 on the gate electrode 326, and forming the n-type source contact region 334 in the silicon 306. These elements may be formed as disclosed in step 202 through step 216 of FIG. 2.

The method 400 continues with step 402, which includes forming the silicon recess 346 in the silicon 306, and the formation of the silicon recess nitride spacer 345. The silicon recess 346 is initially defined in the n-type drift region 320 using either a photoresist mask or a hard mask process. The hard mask can be a silicon nitride or silicon dioxide material. The silicon recess 346 is formed using either a plasma etch process or a wet etch process on the silicon 306 exposed by the hard mask.

The silicon recess nitride spacer 345 may be formed by depositing one or more conformal layers of a nitride dielectric material over the silicon recess 346. The nitride dielectric material is subsequently removed from horizontal surfaces, that is, surfaces generally parallel to the top surface 318 of the silicon 306, by an anisotropic etch process such as an RIE process, leaving the dielectric material on the lateral surfaces of the silicon recess 346. The upper edges of the silicon recess nitride spacer 345 may protrude above the top surface 318 of the silicon 306.

The method 400 continues with step 404 in which the WBG semiconductor material 344 is formed. The WBG semiconductor material 344 may be formed as a blanket film. After the formation of the WBG semiconductor material 344, the WBG contact layer 337 is formed. The WBG contact layer 337 may be formed as a blanket film. After the formation of the WBG semiconductor material 344 and the WBG contact layer 337, a photolithography step and a wet etch or plasma etch process may be used to remove WBG semiconductor material 344 and WBG contact layer 337 from areas outside of the silicon recess 346, such that the WBG semiconductor material 344 and WBG contact layer 337 remain in the silicon recess 346. Alternatively, a hard mask may be used to mask areas outside of the silicon recess 346 and a selective deposition process may be used to form the WBG semiconductor material 344 in the silicon recess 346. After formation of the WBG semiconductor material 344 in the silicon recess 346, a second selective deposition process may be used to form the WBG contact layer 337 on the WBG semiconductor material 344. After the formation of the WBG semiconductor material 344 and the WBG contact layer 337, the hard mask is removed. The WBG semiconductor material 344 and the WBG contact layer 337 form the WBG structure 348.

The method 400 continues with step 406, which includes forming a silicide block layer, not explicitly shown in FIG. 3, over the top surface 318 of the silicon 306 in and over the WBG structure 348. The silicide block layer may include one or more sublayers of dielectric material that do not form silicide with an overlying metal layer during a metal silicide formation process. The silicide block layer may include silicon dioxide or silicon nitride, by way of example. The silicide block layer may have a thickness of 10 nanometers to 100 nanometers, for example. The silicide block layer may be formed by an LPCVD process or a PECVD process, for example. The n-type source contact region 334 is free of the silicide block layer, to enable formation of the metal silicide 336 on the n-type source contact region 334 and other regions of the silicon 106 which are not covered by the silicide block layer. After the silicide block layer is formed, the metal silicide 336 is formed on the silicon 306 areas exposed by the silicide block layer. The metal silicide 336 may optionally be formed on polysilicon in the gate electrode 326. The metal silicide 336 may be formed as disclosed in reference to step 222 of FIG. 2.

The method 400 continues with step 408, which includes removing the silicide block layer in the area for the WBG structure 348, and to expose the top surface 318 of the silicon 306. The silicide block layer may be removed by a wet etch process or a plasma etch process. Other methods for removing the silicide block layer are within the scope of step 408.

The method 400 continues with step 410, which includes forming the PMD liner 338 over the microelectronic device 300. The PMD liner 338 covers the hybrid component 302. The PMD liner 338 may be formed as disclosed in reference to step 224 of FIG. 2.

The method 400 continues with step 412, which includes forming the source-connected field plate 340 over the PMD liner 338. The field plate isolation layer may optionally be formed over the PMD liner 338, by a PECVD process using TEOS, for example. The source-connected field plate 340 may be formed by forming a layer of conductive material over the PMD liner 338, and over the field plate isolation layer, if present. The layer of conductive material may be defined by an etch process where areas exposed by an etch mask are removed leaving a defined source-connected field plate 340, pattern and etch steps not explicitly shown.

The method 400 continues with step 414, which includes forming the PMD layer 342 over the PMD liner 338 and the source-connected field plate 340. The PMD layer 342 may be formed by one or more dielectric deposition processes, including a PECVD process using TEOS, an HDP process, or a HARP using TEOS and ozone, by way of example. The PMD layer 342 may be planarized by an oxide CMP process.

The method 400 continues with step 416, which includes forming the contacts 350 through the PMD layer 342 to form an electrical connection to the WBG structure 348, and to form electrical connections to the gate electrode (out of the plane of FIG. 3), the source-connected field plate 340, and the n-type source contact region 334, through the metal silicide 336. The contacts 350 may be formed as disclosed in reference to step 228 of FIG. 2.

Fabrication of the microelectronic device 300 continues with step 418 which includes forming the interconnects 356 on the contacts 350. The interconnects 356 may be formed as disclosed in reference to step 230 of FIG. 2, for forming the interconnects 356 on the contacts 350.

Figure 5:
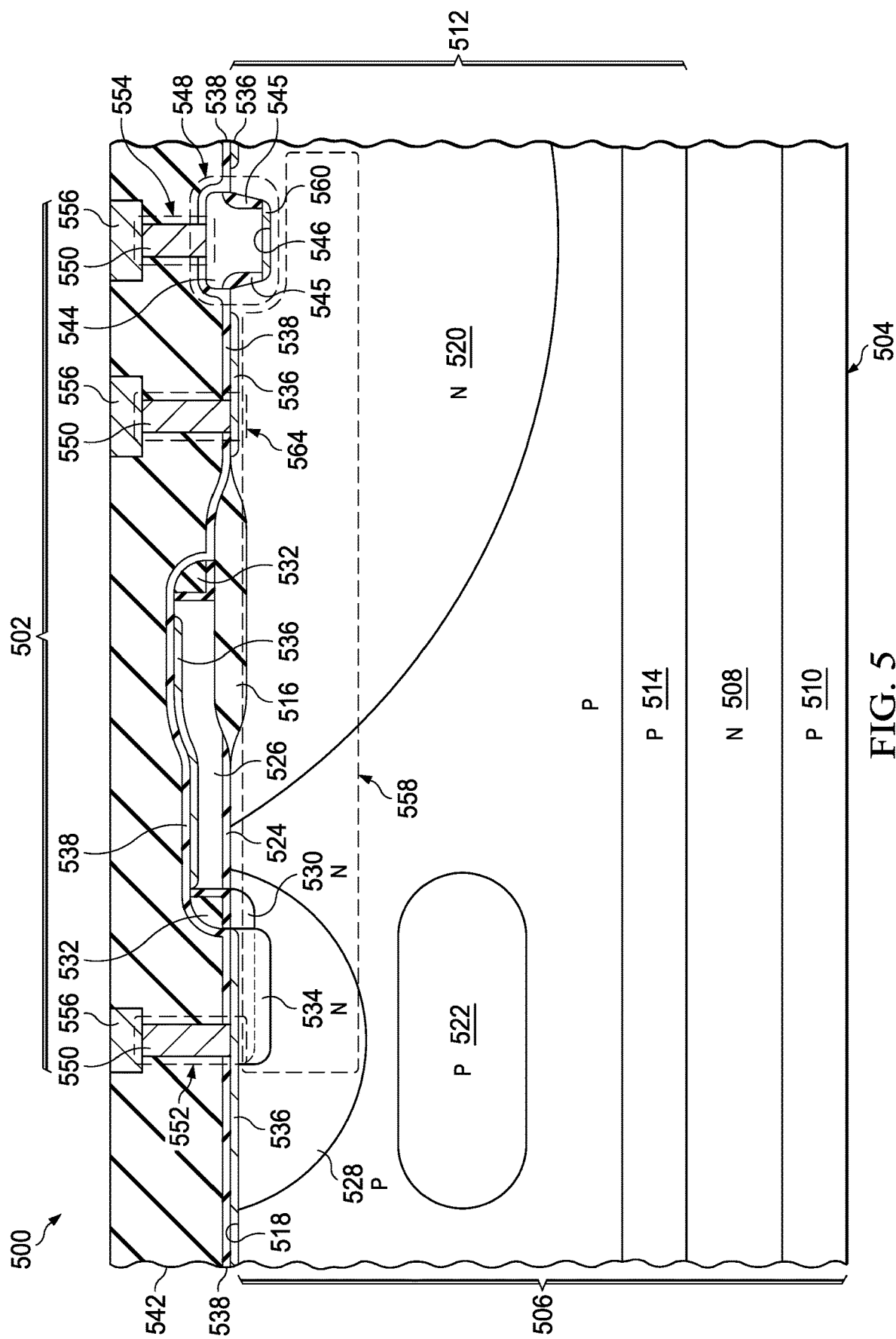
FIG. 5 is a cross section of an example microelectronic device having a hybrid component with a WBG structure and an interface layer between the WBG semiconductor material and the silicon semiconductor material.

FIG. 5 is a cross section of an example microelectronic device 500 having a hybrid component 502 with a WBG structure 548 having an interface layer 560 between WBG semiconductor material 544 and the silicon semiconductor material 506. The microelectronic device 500 may be manifested as any of the device types disclosed in reference to the microelectronic device 100 of FIG. 1. The hybrid component 502 of this example is described as an LDMOS transistor with a drain tied field plate. Other manifestations of the hybrid component 502 are within the scope of this example. The microelectronic device 500 includes a substrate 504 that has silicon semiconductor material 506, referred to herein as the silicon 506. The substrate 504 may be manifested as any of the substrate types disclosed in reference to the substrate 104 of FIG. 1.

The substrate 504 may include an optional NBL 508 on a base wafer 510. The substrate 504 may include an epitaxial layer 512 of silicon on the NBL 508. In versions of this example in which the substrate 504 lacks the NBL 508, the epitaxial layer 512 may be directly on the base wafer 510. The substrate 504 may also include an optional blanket PBL 514 in the epitaxial layer 512. The optional NBL 508, the base wafer 510, the epitaxial layer 512, and the optional blanket PBL 514 may have the dimensions and dopant concentrations disclosed in reference to the NBL 108, the base wafer 110, the epitaxial layer 112, and the PBL 114 of FIG. 1.

The microelectronic device 500 of this example includes a field relief dielectric layer 516 at a top surface 518 of the silicon 506, extending from a subsequently-formed gate dielectric layer 524 partway over a subsequently-formed n-type drift region 520. The field relief dielectric layer 516 may have the structure and composition disclosed in reference to the field relief dielectric layer 116 of FIG. 1.

The hybrid component 502 of this example includes the n-type drift region 520 in the silicon 506, extending partway under the field relief dielectric layer 516. The hybrid component 502 of this example may include a patterned PBL 522 in the epitaxial layer 512, under a subsequently-formed p-type body well 528. The hybrid component 502 of this example includes a gate dielectric layer 524 on the top surface 518 of the silicon 506, extending from the field relief dielectric layer 516 partway over subsequently-formed p-type body well 528. The hybrid component 502 of this example includes a gate electrode 526 on the gate dielectric layer 524 and extending partway over the field relief dielectric layer 516. The hybrid component 502 of this example includes the p-type body well 528 in the silicon 506. The p-type body well 528 extends partway under the gate electrode 526, proximate to the n-type drift region 520. The hybrid component 502 of this example further includes a shallow n-type well 530 in the silicon 506, surrounded by the p-type body well 528, extending in the silicon 506 proximate to an edge of the gate electrode 526, opposite from the n-type drift region 520. The hybrid component 502 of this example may include sidewall spacers 532 on lateral surfaces of the gate electrode 526. The hybrid component 502 of this example includes an n-type source contact region 534 in the silicon 506, adjacent to the sidewall spacers 532, opposite from the n-type drift region 520. The n-type drift region 520, the patterned PBL 522, the gate dielectric layer 524, the gate electrode 526, the p-type body well 528, the shallow n-type well 530, the sidewall spacers 532, and the n-type source contact region 534 may have the properties, dimensions, compositions, and dopant concentrations disclosed in reference to the corresponding elements of FIG. 1.

The hybrid component 502 of this example may include metal silicide 536 on the silicon 506 on the n-type source contact region 534, and on the n-type drift region 520 around a WBG structure 548 as part of a silicon-tied field plate 564. The hybrid component 502 may further include the metal silicide 536 on the gate electrode 526. The metal silicide 536 may have any of the compositions disclosed in reference to the metal silicide 136 of FIG. 1. The metal silicide 536 may be restricted to the n-type source contact region 534 and the n-type drift region 520 over the WBG semiconductor material 544 by a silicide block layer, as disclosed in reference to step 406 through 408 of FIG. 4. The microelectronic device 500 includes a PMD liner 538 formed over the substrate 504. The microelectronic device 500 includes a PMD layer 542 over the PMD liner 538. The PMD liner 538 and the PMD layer 542 are both electrically non-conductive, and each may include one or more sublayers of dielectric material. The PMD liner 538 and the PMD layer 542 may have the structures and compositions disclosed in reference to the PMD liner 138 and the PMD layer 142 of FIG. 1.

The hybrid component 502 includes a silicon recess nitride spacer 545 and a the WBG semiconductor material 544 on the interface layer 560 located in a silicon recess 546 on the silicon 506 in the n-type drift region 520. The silicon recess nitride spacer 545 directs current to a bottom of the silicon recess 546 and provides more uniform current density between the WBG semiconductor material 544 and the silicon 506. The interface layer 560 may include, by way of example, one or more metals, graphene, two-dimensional metal carbide, metal carbonitride, a metal nitride, chalcogenides, hexagonal boron nitride, rare earth metals, metal silicide and two-dimensional tin or molybdenum compounds, and may include a cap layer of gold, to enhance nucleation of the subsequently-formed WBG semiconductor material 544. The interface layer 560 between the WBG semiconductor material 544 and the silicon 106 is less than 100 nanometers in thickness. The WBG semiconductor material 544 may have any of the compositions and structures discussed in reference to the WBG semiconductor material 144 of FIG. 1. The interface layer 560 and the WBG semiconductor material 544 provides a WBG structure 548 of the hybrid component 502. The WBG structure 548 extends into the silicon 506 and may extend into the PMD layer 542. The WBG structure 548 has a lateral dimension adjacent to the silicon 506 that is no greater than 10 times a thickness of the WBG structure 548 or 10 times a depth of the silicon recess 546, whichever is greater, in at least one lateral direction. In this example, additional dielectric material may be formed over the WBG semiconductor material 544 as part of the PMD layer 542, to provide a planar top surface of the PMD layer 542, as indicated in FIG. 5, accruing the advantage disclosed in reference to FIG. 1.

The microelectronic device 500 includes the contacts 550 through the PMD layer 542 and the PMD liner 538. The contacts 550 are conductive, and provide electrical connections to the metal silicide 536 on the n-type source contact region 534, the gate electrode 526 (out of the plane of FIG. 5), the metal silicide 536 on the n-type drift region 520 around the WBG semiconductor structure 548, and the WBG semiconductor material 544. The contacts 550 to the metal silicide 536 on the n-type drift region 520 around the WBG semiconductor structure 548 provide the silicon-tied field plate 564. The contacts 550 may have any of the structures and compositions disclosed in reference to the contacts 150 of FIG. 1. Other compositions and structures for the contacts 550 are within the scope of this example.

The microelectronic device 500 includes interconnects 556 on the contacts 550. The interconnects 556 are conductive. At least one of the interconnects 556 provides an electrical connection to the n-type source contact region 534 through one or more of the contacts 550. Another of the interconnects 556 provides an electrical connection to the WBG semiconductor material 544 through one or more of the contacts 550. Another of the interconnects 556 provides an electrical connection to the gate electrode 526 (out of the plane of FIG. 5). Another of the contacts 550 provides a connection to the silicon-tied field plate 564. The interconnects 556 may have any of the structures and compositions disclosed in reference to the interconnects 156 of FIG. 1. Other compositions and structures for the contacts 550 and the interconnects 556 are within the scope of this example.

A combination of at least the n-type source contact region 534, the shallow n-type well 530, the p-type body well 528, and the n-type drift region 520 provide a silicon portion 558 of the hybrid component 502. A combination of the metal silicide 536 on the n-type source contact region 534 and the contacts 550 on the metal silicide 536 on the n-type source contact region 534 provides a first current terminal 552 of the hybrid component 502. The first current terminal 552 is on the silicon portion 558 of the hybrid component 502. The contacts 550 on the WBG structure 548 provides a second current terminal 554 of the hybrid component 502. Operation of the hybrid component 502 may be similar to the operational details disclosed in reference to the hybrid component 102 of FIG. 1.

Figure 6:
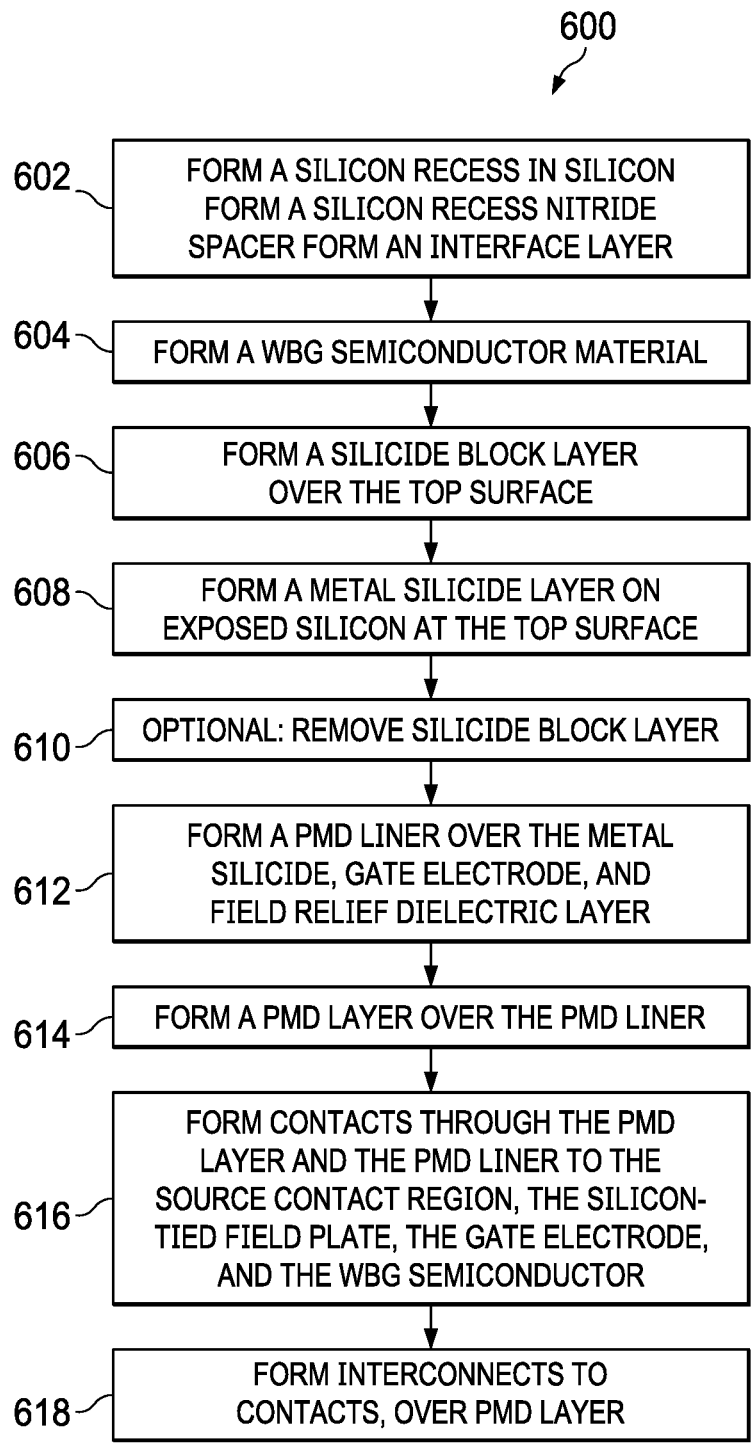
FIG. 6 presents a flowchart of an example method of forming the microelectronic device of FIG. 5.

FIG. 6 presents a flowchart of an example method 600 of forming the microelectronic device 500 of FIG. 5. Structural elements referred to in the steps of the method 600 are shown in FIG. 4. Fabrication of the microelectronic device 500 includes optionally forming the NBL 508 on the base wafer 510, optionally forming the PBL 514 in the silicon 506, forming the epitaxial layer 512 on the NBL 508, forming the field relief dielectric layer 516 at the top surface 518 of the silicon 506, forming the n-type drift region 520 in the silicon 506, forming the patterned PBL 522 in the epitaxial layer 512, forming the gate dielectric layer 524 on the top surface 518 of the silicon 506, forming the gate electrode 526 on the gate dielectric layer 524, forming the p-type body well 528 in the silicon 506 adjacent to the gate electrode 526, opposite from the n-type drift region 520, and forming the shallow n-type well 530 in the p-type body well 528, forming the sidewall spacers 532 on the gate electrode 526, and forming the n-type source contact region 534 in the silicon 506. These elements may be formed as disclosed in step 202 through 216 of FIG. 2.

The method 600 continues with step 602, which includes forming the silicon recess 546 in the silicon 506, forming the silicon recess nitride spacer 545, and forming the interface layer 560. The silicon recess 546 is initially defined using either a photoresist mask or a hard mask process. The hard mask can be a silicon nitride or silicon dioxide material. The silicon recess 546 is formed using either a plasma etch process or a wet etch process on the silicon 506 exposed by the hard mask.

After the formation of the silicon recess 546, the silicon recess nitride spacer 345 may be formed by depositing one or more conformal layers of nitride dielectric material over the silicon recess 546. The dielectric material is subsequently removed from horizontal surfaces, that is, surfaces generally parallel to the top surface 518 of the silicon 506, by an anisotropic etch process such as an RIE process, leaving the dielectric material on the lateral surfaces of the silicon recess 546. The upper edges of the silicon recess nitride spacer 545 may protrude above the top surface 518 of the silicon 506.

After the formation of the silicon recess nitride spacer 545, the interface layer 560 is formed. The interface layer 560 may include, by way of example, one or more metals, graphene, two-dimensional metal carbide, metal carbonitride, a metal nitride, chalcogenides, hexagonal boron nitride, rare earth metals, metal silicide and two-dimensional tin or molybdenum compounds, and may include a cap layer of gold, to enhance nucleation of the subsequently-formed WBG semiconductor material 544. The interface layer 560 may be a monolayer or two monolayers thick, or may have a thickness up to a 100 nanometers. The interface layer 560 may be formed using a selective deposition method, or may be formed as a blanket film.

The method 600 continues with step 604 which includes the formation of the WBG semiconductor material 544. The WBG semiconductor material 544 may be formed as a blanket film. After the formation of the WBG semiconductor material 544 a photolithography step and a wet etch or plasma etch process may be used to remove WBG semiconductor material 544 and the interface layer 560 from areas outside of the silicon recess 546, leaving the interface layer 560 and the WBG semiconductor material 544 in the silicon recess 546 region on the interface layer 560. Alternatively, a hard mask may be used to mask areas outside of the silicon recess 546 and a selective deposition process may be used to form the WBG semiconductor material 544 on the interface layer 560 in the silicon recess 546.

The method 600 continues with step 606, which includes forming a silicide block layer, not explicitly shown in FIG. 5, over the top surface 518 of the silicon 506 in an area for the WBG structure 548. The silicide block layer may include one or more sublayers of dielectric material that do not form silicide with an overlying metal layer during a metal silicide process. The silicide block layer may include silicon dioxide or silicon nitride, by way of example. The silicide block layer may have a thickness of 10 nanometers to 100 nanometers, for example. The silicide block layer may be formed by and LPCVD process or a PECVD process, for example. The n-type source contact region 534 and the silicon in the region of the subsequently formed silicon-tied field plate 564 are free of the silicide block layer, to enable formation of the metal silicide 536 on the n-type source contact region 534, the silicon-tied field plate 564, and other regions of the silicon 506 which are not covered by the silicide block layer.

The method 600 continues with step 608, which includes forming the metal silicide 536 on the silicon 506 where exposed by the silicide block layer. In this example, the metal silicide 536 is formed at least on the n-type source contact region 534, and around the WBG structure 548 in the area for the silicon-tied field plate 564. The metal silicide 536 may optionally be formed on polysilicon in the gate electrode 526. The metal silicide 536 may be formed as disclosed in reference to step 222 of FIG. 2. Alternatively, the metal silicide 536 may be formed after contact holes for the contacts 550 are formed through the PMD layer 542 and the PMD liner 538, exposing the silicon 506 and the WBG structure 548. A layer of a metal such as titanium may be formed on the silicon 506 and WBG structure 548 exposed by the contact holes. The substrate 504 may subsequently be heated, reacting the titanium with the silicon 506 to form the metal silicide 536 at the bottoms of the contact holes.

The method 600 continues with step 610, which optionally includes removing the silicide block layer in the area for the WBG structure 548, to expose the top surface 518 of the silicon 506 and the WBG structure 548. The silicide block layer may be removed as disclosed in reference to step 408 of FIG. 4. Other methods for removing the silicide block layer are within the scope of step 610.

The method 600 continues with step 612, which includes forming the PMD liner 538 over the microelectronic device 500. The PMD liner 538 may be formed as disclosed in reference to step 224 of FIG. 2.

The method 600 continues with step 614, which includes forming the PMD layer 542 over the PMD liner 538. The PMD layer 542 may be formed as disclosed in reference to step 226 of FIG. 2.

The method 600 continues with step 616, which includes forming the contacts 550 through the PMD layer 542 and the PMD liner 538 to form electrical connections to the WBG structure 548, the gate electrode 526 (out of the plane of FIG. 5), the n-type drift region 520 around the WBG semiconductor material 544, and the n-type source contact region 534. The contacts 550 may be formed as disclosed in reference to step 228 of FIG. 2.

The method 600 continues with step 618 which further includes forming the interconnects 556 on the contacts 550. The interconnects 556 may be formed as disclosed in reference to step 230 of FIG. 2, for forming the interconnects 156 on the contacts 150.

Figure 7:
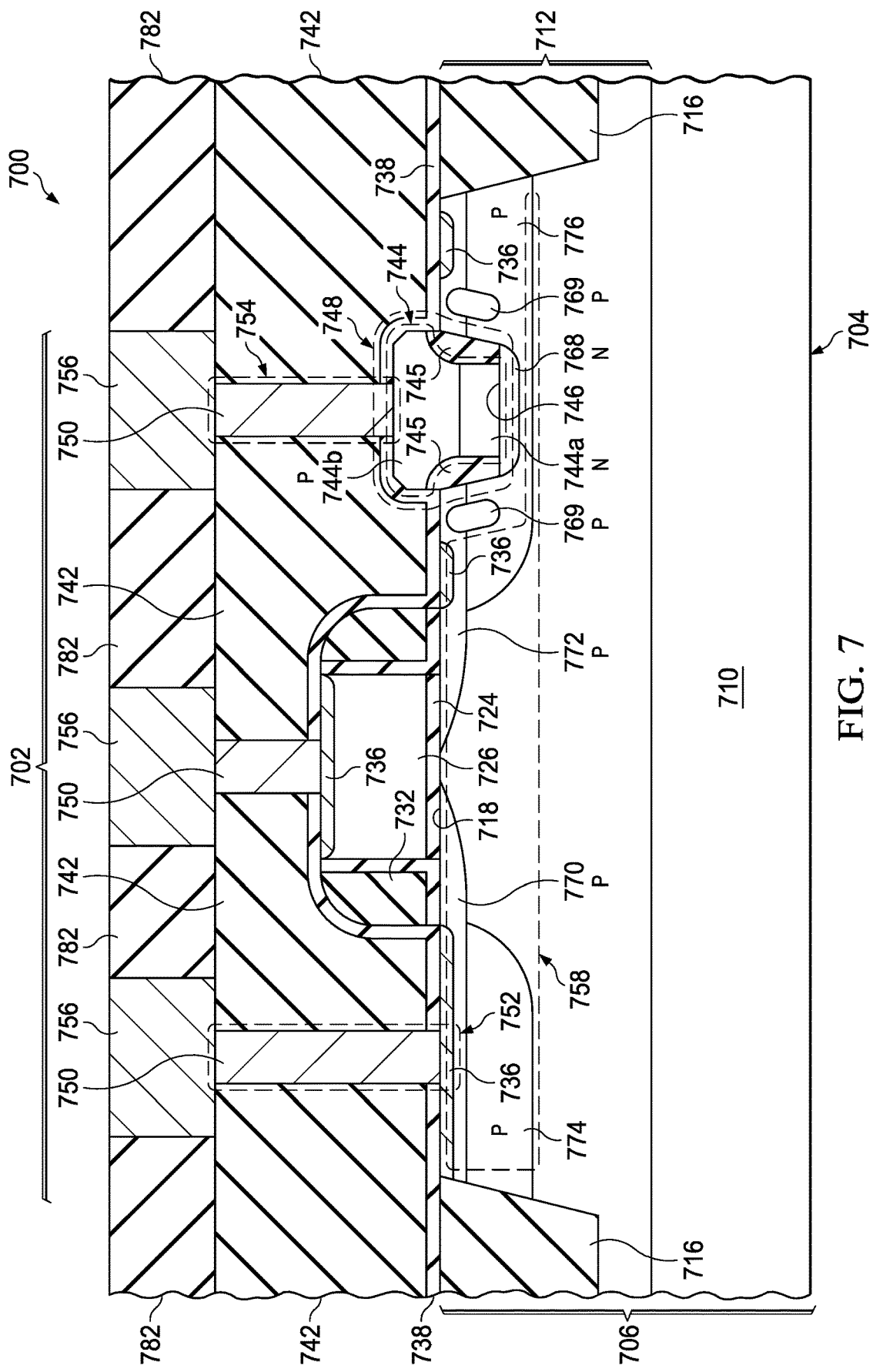
FIG. 7 is a cross section of an example microelectronic device having a hybrid component with a WBG structure. The microelectronic device also contains a n-type heavily doped region and an implant control layer in the silicon semiconductor material adjacent to the silicon recess.

FIG. 7 is a cross section of an example microelectronic device 700 having a hybrid component 702 with a WBG structure 748. The microelectronic device 700 also contains a n-type heavily doped region 768 and an implant control layer 769 in the silicon semiconductor material 706 adjacent to the silicon recess 746. The microelectronic device 700 may be manifested as any of the device types disclosed in reference to the microelectronic device 100 of FIG. 1. The hybrid component 702 of this example is described as a p-channel metal oxide semiconductor (PMOS) transistor. Other manifestations of the hybrid component 702 are within the scope of this example. The microelectronic device 700 includes a substrate 704 that has silicon semiconductor material 706, referred to herein as the silicon 706. The silicon 706 may be a top portion of a bulk silicon wafer, or may be an epitaxial layer 712 on a base wafer 710. The substrate 704 may be manifested as any of the substrate types disclosed in reference to the substrate 104 of FIG. 1.

The microelectronic device 700 of this example includes a field relief dielectric layer 716 at a top surface 718 of the silicon 706, laterally surrounding the hybrid component 702. The field relief dielectric layer 716 may have an STI structure, as depicted in FIG. 7, or may have a LOCOS structure.

The hybrid component 702 of this example includes a p-type source extension 770 and a p-type drain extension 772 in the silicon 706. The silicon 706 between and below the p-type source extension 770 and the p-type drain extension 772 is n-type in this example. The p-type source extension 770 and the p-type drain extension 772 may have a dopant concentration of $1 \times 10^{18}$ atoms/cm$^3$ to $1 \times 10^{20}$ atoms/cm$^3$, by way of example. The silicon 706 between the p-type source extension 770 and the p-type drain extension 772 may have a dopant concentration of $1 \times 10^{16}$ atoms/cm$^3$ to $1 \times 10^{17}$ atoms/cm$^3$, which may affect a threshold potential of the hybrid component 702.

The hybrid component 702 of this example includes a gate dielectric layer 724 on the top surface 718 of the silicon 706, extending over the silicon 706 between the p-type source extension 770 and the p-type drain extension 772 and partially overlapping the p-type source extension 770 and the p-type drain extension 772. The hybrid component 702 of this example further includes a gate electrode 726 on the gate dielectric layer 724. The gate electrode 726 also extends over the silicon 706 between the p-type source extension 770 and the p-type drain extension 772 and partially overlapping the p-type source extension 770 and the p-type drain extension 772. The hybrid component 702 of this example may include sidewall spacers 732 on lateral surfaces of the gate electrode 726. The gate dielectric layer 724, the gate electrode 726, and the sidewall spacers 732 may have any of the compositions and structures disclosed in reference to the gate dielectric layer 124, the gate electrode 126, and the sidewall spacers 132, respectively, of FIG. 1.

The hybrid component 702 of this example includes a p-type source contact region 774 in the silicon 706, adjacent to the gate electrode 726, and overlapping the p-type source extension 770. The hybrid component 702 of this example further includes a p-type drain contact region 776 in the silicon 706, adjacent to the gate electrode 726, opposite from the p-type source contact region 774, and overlapping the p-type drain extension 772. The p-type source contact region 774 and the p-type drain contact region 776 may have a dopant concentration of $1 \times 10^{19}$ atoms/cm$^3$ to $1 \times 10^{21}$ atoms/cm$^3$, by way of example.

The hybrid component 702 includes a silicon recess nitride spacer 745 and a WBG semiconductor material 744 in a silicon recess 746 on the silicon 706 in the p-type drain contact region 776. The silicon recess nitride spacer 745 directs current to a bottom of the silicon recess 746 and provides more uniform current density between the WBG semiconductor material 744 and the silicon 706. The WBG semiconductor material 744 may have any of the compositions and structures discussed in reference to the WBG semiconductor material 144 of FIG. 1. The hybrid component 702 may include an n-type heavily doped region 768 in the silicon 706 immediately below the silicon recess 746, to reduce an electrical resistance between the WBG semiconductor material 744 and the p-type drain contact region 776. The hybrid component 702 may contain a n-type heavily doped region 768 which may have an n-type dopant concentration of $1 \times 10^{19}$ atoms/cm$^3$ to $1 \times 10^{21}$ atoms/cm$^3$, by way of example. The n-type heavily doped region 768 may extend to a depth of 100 nanometers to 2 microns below the top surface 718, by way of example. The hybrid component 702 may also contain an implant control layer 769 adjacent to the silicon recess 746. The implant for the implant control layer 769 may be a p type implant dose of $1 \times 10^2$ atoms/cm$^3$ to $1 \times 10^{14}$ atoms/cm$^2$, by way of example. The WBG semiconductor material 744 provides a WBG structure 748 of the hybrid component 702. The WBG structure 748 is in the silicon recess 746. The WBG structure 748 has a lateral dimension adjacent to the silicon 706 that is no greater than 10 times a thickness of the WBG structure 748 or 10 times a depth of the silicon recess 746, whichever is greater, in at least one lateral direction. In some versions of this example, the WBG semiconductor material 744 may have an n-type portion 744a on the n-type heavily doped region 768 and a p-type portion 744b on the n-type portion 744a, so that the hybrid component 702 is manifested as an IGBT, instead of the LDMOS transistor.

The microelectronic device 700 includes a metal silicide 736 on the silicon 706, and a PMD liner 738 over the substrate 704. The microelectronic device 700 includes a PMD layer 742 over the PMD liner 738. The PMD liner 738 and the PMD layer 742 are both electrically non-conductive, and each may include one or more sublayers of dielectric material. The silicide may have structures and compositions disclosed in reference to the metal silicide 136 of FIG. 1. The PMD liner 738 and the PMD layer 742 may have the structures and compositions disclosed in reference to the PMD liner 138 and the PMD layer 142 of FIG. 1.

The microelectronic device 700 includes contacts 750 through the PMD layer 742 and the PMD liner 738, making electrical connections to the metal silicide 736 on the p-type source contact region 774, the metal silicide 736 on the gate electrode 726, and the WBG structure 748. The contacts 750 are conductive and the contacts 750 may have any of the structures and compositions disclosed in reference to the contacts 150 of FIG. 1. Other compositions and structures for the contacts 750 are within the scope of this example.

A combination of at least the p-type source contact region 774, the p-type source extension 770, the p-type drain contact region 776, the p-type drain extension 772, and the silicon 706 between the p-type source extension 770 and the p-type drain extension 772 provide a silicon portion 758 of the hybrid component 702. A combination of the contacts 750 on the p-type source contact region 774 and the contacts 750 provides a first current terminal 752 of the hybrid component 702. The first current terminal 752 is on the silicon portion 758 of the hybrid component 702. The contacts 750 on the WBG structure 748 provides a second current terminal 754 of the hybrid component 702. Operation of the hybrid component 702 may be similar to the operational details disclosed in reference to the hybrid component 102 of FIG. 1.

The microelectronic device 700 may include an IMD layer 782 on the PMD layer 742. The IMD layer 782 is electrically non-conductive, and may include one or more sublayers of dielectric material, including a silicon dioxide layer and a cap layer of silicon nitride, silicon carbide, or silicon carbonitride, to provide a stop layer for a copper CMP process. The microelectronic device 700 includes interconnects 756 on the contacts 750. The interconnects 756 are conductive. The interconnects 756 may have a damascene structure, as disclosed in reference to FIG. 1. Other structures for the interconnects 756 are within the scope of this example. At least one of the interconnects 756 provides an electrical connection to the p-type source contact region 774 through one or more of the contacts 750. Another of the interconnects 756 provides an electrical connection to the WBG structure 748 through one or more of the contacts 750. Another of the interconnects 756 provides an electrical connection to the gate electrode 726 through one or more of the contacts 750.

The hybrid component 702 of this example may advantageously enable cost-efficient integration of a high voltage transistor in a complementary metal oxide semiconductor (CMOS) fabrication sequence. An n-channel metal oxide semiconductor (NMOS) transistor with a similar WBG structure 748 may be fabricated in the microelectronic device 700 by appropriate changes in dopant polarities.

Figure 8:
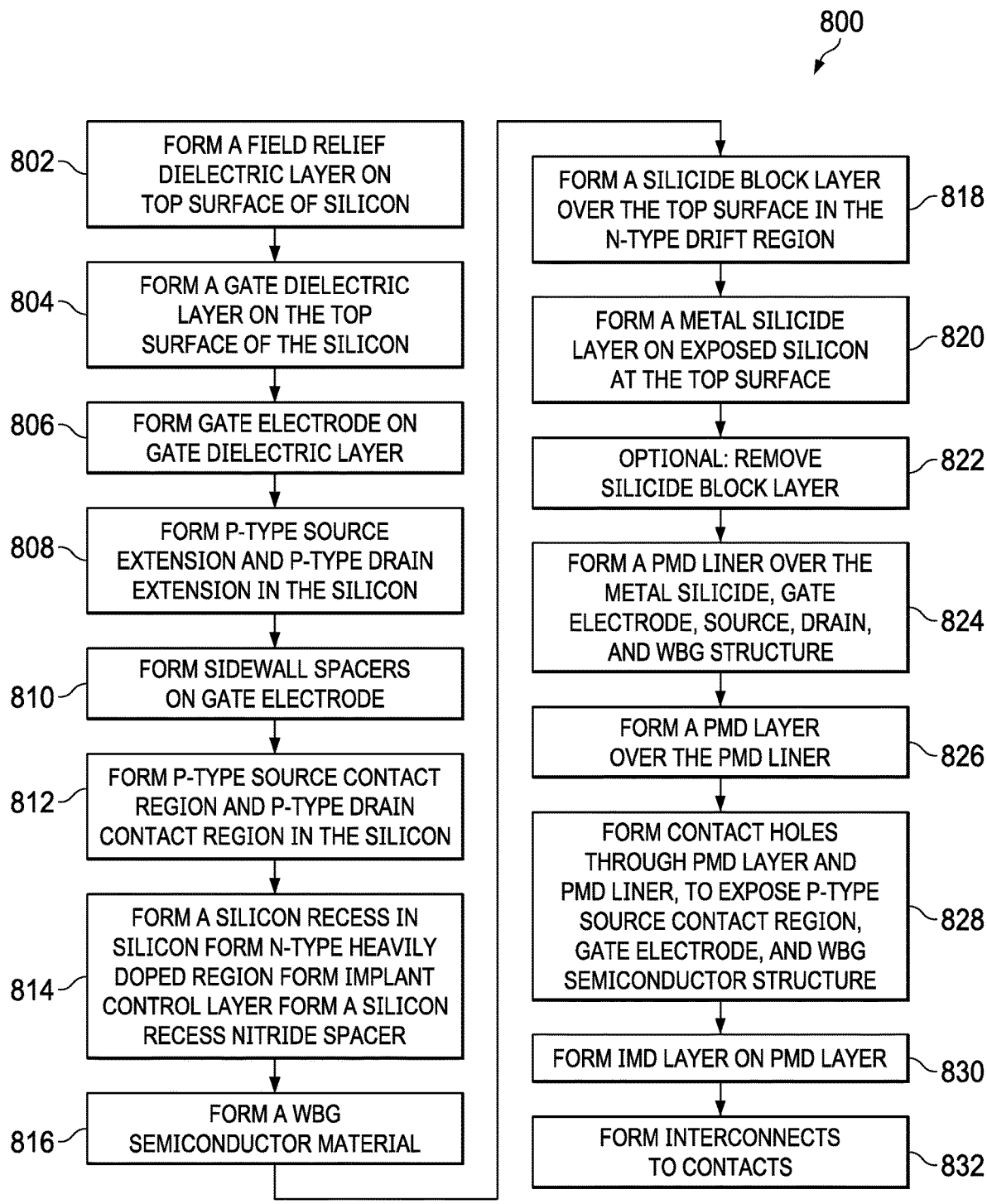
FIG. 8 presents a flowchart of an example method of forming the microelectronic device of FIG. 7.

FIG. 8 presents a flowchart of an example method 800 of forming the microelectronic device 700 of FIG. 7. The method 800 includes step 802, which includes forming the field relief dielectric layer 716 at the top surface 718 of the silicon 706. The field relief dielectric layer 716 may be formed by an STI process, as disclosed in reference to step 204 of FIG. 2. Alternatively, the field relief dielectric layer 716 may be formed by a LOCOS process, also disclosed in reference to step 204 of FIG. 2. Other methods of forming the field relief dielectric layer 716 are within the scope of step 802.

The method 800 continues with step 804, which include forming the gate dielectric layer 724 on the top surface 718 of the silicon 706. The gate dielectric layer 724 may be formed by any of the methods disclosed in step 210 of FIG. 2, in reference to forming the gate dielectric layer 124 of FIG. 1.

The method 800 continues with step 806, which includes forming the gate electrode 726 on the gate dielectric layer 724. The gate electrode 726 may be formed by any of the methods disclosed in step 210 of FIG. 2, in reference to forming the gate electrode 126 of FIG. 1.

The method 800 continues with step 808, which includes forming the p-type source extension 770 and the p-type drain extension 772 in the silicon 706. The p-type source extension 770 and a p-type drain extension 772 may be formed by forming an implant mask, not explicitly shown, which exposes the gate electrode 726 and the silicon 706 on opposites sides of the gate electrode 726, and implanting p-type dopants, such as boron and gallium, and optionally indium, into the silicon 706 where exposed by the gate electrode 726 and the implant mask. Boron may be implanted as boron difluoride, to add fluorine to the p-type source extension 770 and a p-type drain extension 772. The p-type dopants may be implanted at a total dose of $1 \times 10^{14}$ ions/cm$^2$ to $1 \times 10^{15}$ ions/cm$^2$, by way of example. The substrate 704 is subsequently heated by a rapid thermal process or a flash anneal process to activate the implanted p-type dopants.

The method 800 continues with step 810, which includes forming the sidewall spacers 732 on lateral surfaces of the gate electrode 726. The sidewall spacers 732 may be formed as disclosed in step 214 of FIG. 2, in reference to forming the sidewall spacers 132 of FIG. 1.

The method 800 continues with step 812, which includes forming the p-type source contact region 774 and the p-type drain contact region 776 in the silicon 706. The p-type source contact region 774 and the p-type drain contact region 776 may be formed by forming an implant mask, not explicitly shown, which exposes the gate electrode 726, the sidewall spacers 732, and the p-type source extension 770 and the p-type drain extension 772 in the silicon 706. P-type dopants such as boron are implanted into the silicon 706 where exposed by the gate electrode 726, the sidewall spacers 732, and the implant mask. The p-type dopants may be implanted at a total dose of $1 \times 10^{15}$ ions/cm$^2$ to $5 \times 10^{15}$ ions/cm$^2$, by way of example. The substrate 704 is subsequently heated by a rapid thermal process or a flash anneal process to activate the implanted p-type dopants.

The method 800 continues with step 814, which includes forming the silicon recess 746 in the silicon 706, and the formation of the silicon recess nitride spacer 745. The silicon recess 746 in the silicon 706 is initially defined using either a photoresist mask or a hard mask process. The hard mask can be a silicon nitride or silicon dioxide material. The silicon recess 746 is formed using either a plasma etch process or a wet etch process on the silicon 706 exposed by the hard mask. After the formation of the silicon recess 746, the n-type heavily doped region 768 is formed using an n-type dopant concentration of $1 \times 10^{19}$ atoms/cm$^3$ to $1 \times 10^{21}$ atoms/cm$^3$, by way of example. After the formation of the n-type heavily doped region 768, the implant control layer 769 adjacent to the silicon recess 746 is formed using a p type implant dose of $1 \times 10^2$ atoms/cm$^3$ to $1 \times 10^{14}$ atoms/cm$^2$, by way of example. After the formation of the implant control layer 769, the silicon recess nitride spacer 745 is formed. The silicon recess nitride spacer 745 may be formed by depositing one or more conformal layers of dielectric material over the silicon recess 746. The dielectric material is subsequently removed from horizontal surfaces, that is, surfaces generally parallel to the top surface 718 of the silicon 706, by an anisotropic etch process such as an RIE process, leaving the dielectric material on the lateral surfaces of the silicon recess 746. The upper edges of the silicon recess nitride spacer 745 may protrude above the top surface 718 of the silicon 706.

The method 800 continues with step 816 which includes formation of the WBG semiconductor material 744. The WBG semiconductor material 744 may be formed as a blanket film. After the formation of the WBG semiconductor material 744 a photolithography step and a wet etch or plasma etch process may be used to remove WBG semiconductor material 744 from areas outside of the silicon recess 746, such that WBG semiconductor material 744 remains in the silicon recess 746 region. Alternatively, a hard mask may be used to mask areas outside of the silicon recess 746 and a selective deposition process may be used to form the WBG semiconductor material 744 in the silicon recess 746. After the selective deposition of the WBG semiconductor material 744, the hard mask is removed leaving the WBG semiconductor material 744 in the silicon recess 746.

The method 800 includes step 818, which includes forming a silicide block layer, not explicitly shown in FIG. 3, over the top surface 718 of the silicon 706 in an area for the WBG structure 748. The silicide block layer may include one or more sublayers of dielectric material that do not form silicide with an overlying metal layer during a metal silicide formation process. The silicide block layer may include silicon dioxide or silicon nitride, by way of example. The silicide block layer may have a thickness of 10 nanometers to 100 nanometers, for example. The silicide block layer may be formed by and LPCVD process or a PECVD process, for example. The p-type source contact region 774 and the p-type drain contact region 776 in the silicon 706 are free of the silicide block layer, to enable formation of the metal silicide 736 on the p-type source contact region 774 and the p-type drain contact region 776 in the silicon 706. The silicide block layer may be used to cover the WBG semiconductor material 744 to prevent reaction of the WBG structure 748 with the metal used during the subsequent formation of metal silicide 736 in step 820.

The method 800 continues with step 820 which includes forming of the metal silicide 736 on the silicon 706. The metal silicide 736 may optionally be formed on polysilicon in the gate electrode 726. The metal silicide 736 may be formed as disclosed in reference to step 222 of FIG. 2.

The method 800 continues with step 822, which includes optionally removing the silicide block layer in the area for the WBG structure 748, to expose the WBG structure 748. The silicide block layer may be removed as disclosed in reference to step 408 of FIG. 4. Other methods for removing the silicide block layer are within the scope of step 822.

The method 800 continues with step 824, which includes forming the PMD liner 738 over the microelectronic device 700. The PMD liner 738 may be formed as disclosed in reference to step 224 of FIG. 2.

The method 800 continues with step 826, which includes forming the PMD layer 742 over the PMD liner 738. The PMD layer 742 may be formed as disclosed in reference to step 226 of FIG. 2.

The method 800 continues with step 828, which includes the forming of contacts 750 through the PMD layer 742 and the PMD liner 738, to expose the p-type source contact region 774, the gate electrode 726, and the WBG structure 748. The contacts 750 may be formed as disclosed in reference to step 228 of FIG. 2.

The method 800 continues with step 830, which includes forming the IMD layer 782 on the PMD layer 742 and the contacts 750. The IMD layer 782 may be formed by a series of PECVD processes to form dielectric sublayers of silicon dioxide and the cap layer (not specifically shown) of silicon nitride, silicon carbide, or silicon carbonitride.

The method 800 continues with step 832, which includes forming the interconnects 756 in the IMD layer 782 on the contacts 750. The interconnects 756 may be formed by a damascene process, as disclosed in reference to step 230 of FIG. 2. Alternatively, the interconnects 756 may be formed by an etched aluminum process, prior to forming the IMD layer 782. Other methods of forming the interconnects 756 are within the scope of step 834.

Figure 9:
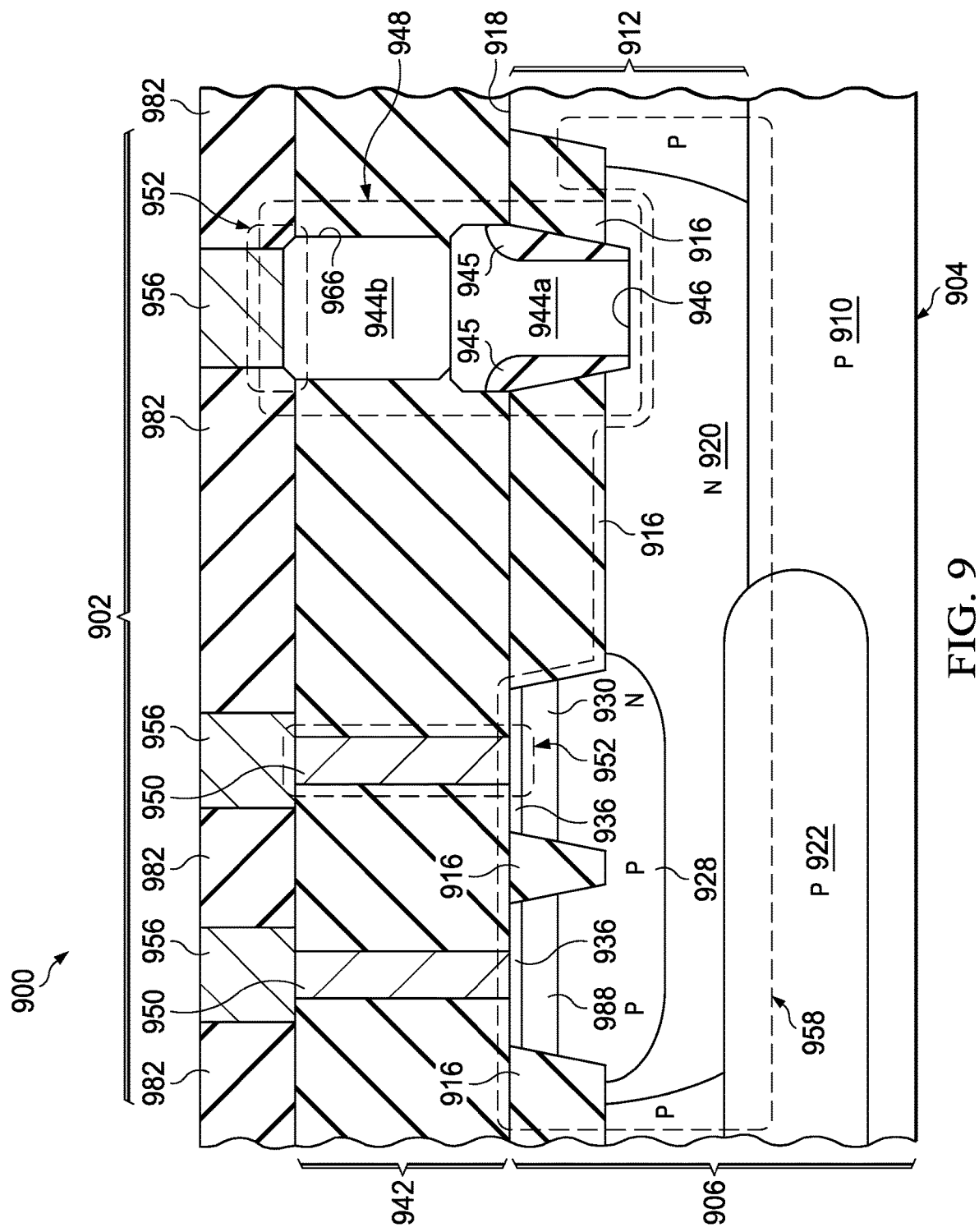
FIG. 9 is a cross section of an example microelectronic device having a hybrid component with a WBG structure. The micro electronic device includes a first WBG semiconductor at least partially within the silicon recess and a second WBG semiconductor material in a WBG opening through the PMD layer.

FIG. 9 is a cross section of an example microelectronic device 900 having a hybrid component with a WBG structure 948. The micro electronic device 900 includes a first WBG semiconductor 944a at least partially within the silicon recess 946 and a second WBG semiconductor material 944b in a WBG opening 966 through the PMD layer 942. The microelectronic device 900 may be manifested as any of the device types disclosed in reference to the microelectronic device 100 of FIG. 1. The hybrid component 902 of this example is described as an NPN bipolar transistor, however, other manifestations of the hybrid component 902 are within the scope of this example. The microelectronic device 900 includes a substrate 904 that has silicon semiconductor material 906, referred to herein as the silicon 906. The substrate 904 may be manifested as any of the substrate types disclosed in reference to the substrate 104 of FIG. 1.

The substrate 904 of this example may include a portion of a base wafer 910 in the silicon 906, having p-type conductivity. The base wafer 910 may have an average dopant concentration of $1 \times 10^{14}$ atoms/cm$^3$ to $1 \times 10^{17}$ atoms/cm$^3$, by way of example. The substrate 904 may also include a patterned PBL 922 contacting the base wafer 910. The patterned PBL 922 may have an average dopant concentration more than twice the average dopant concentration of the base wafer 910. The substrate 904 may further include an epitaxial layer 912 on the base wafer 910, extending over the patterned PBL 922. In this example, the epitaxial layer 912 may be p-type, and may be 2 microns to 8 microns thick, for example. The epitaxial layer 912 may have an average dopant concentration of $1 \times 10^{15}$ atoms/cm$^3$ to $1 \times 10^{17}$ atoms/cm$^3$, by way of example. The epitaxial layer 912 extends to a top surface 918 of the silicon 906. The top surface 918 may not be planar in this example.

The hybrid component 902 of this example includes an n-type drift region 920 in the epitaxial layer 912. The n-type drift region 920 extends to the top surface 918 of the silicon 906. In this example, the n-type drift region 920 may have an average dopant concentration of $4 \times 10^{16}$ atoms/cm$^3$ to $1\times10^{17}$ atoms/cm$^3$, by way of example. The n-type drift region 920 provides a portion of a collector of the hybrid component 902.

The microelectronic device 900 includes a field relief dielectric layer 916 at a top surface 918 of the silicon 906, extending over a portion of the n-type drift region 920. The field relief dielectric layer 916 may have an STI structure, with the field relief dielectric layer 916 located in an isolation trench in the silicon 906, as depicted in FIG. 9. Other configurations for the field relief dielectric layer 916 are within the scope of this example.

The hybrid component 902 of this example includes a p-type base well 928 in the silicon 906. The p-type base well 928 may be laterally surrounded by the n-type drift region 920, as depicted in FIG. 9. The p-type base well 928 may have an average dopant concentration of $1\times10^{15}$ atoms/cm$^3$ to $1\times10^{16}$ atoms/cm$^3$, by way of example.

The hybrid component 902 of this example includes a p-type base 988 in the silicon 906, surrounded by the p-type base well 928. The p-type base 988 has a higher average dopant concentration than the p-type base well 928, to provide a reduced resistance connection to the p-type base well 928.

The hybrid component 902 of this example includes an n-type emitter 930 in the silicon 906, surrounded by the p-type base well 928. The n-type emitter 930 may have an average dopant concentration of $1\times10^{18}$ atoms/cm$^3$ to $1\times10^{20}$ atoms/cm$^3$, by way of example.

The hybrid component 902 of this example may include a silicon recess 946 in the silicon 906 in the n-type drift region 920, laterally spaced from the p-type base well 928. The silicon recess 946 may extend to a depth of 100 nanometers to 1 micron into the silicon 906, for example.

The microelectronic device 900 includes metal silicide 936 over the p-type base 988 and the n-type emitter 930. The metal silicide 936 may have any of the compositions and structures disclosed in reference to the metal silicide 136 in FIG. 1.

The microelectronic device 900 includes PMD layer 942 over the top surface 918 of the silicon 906. The PMD layer 942 may have any of the compositions and layer structures disclosed in reference to the PMD layer 142 of FIG. 1. The microelectronic device 900 further includes contacts 950 through the PMD layer 942, on the p-type base 988, and the n-type emitter 930. The contacts 950 are conductive, and may have any of the compositions and structures disclosed in reference to the contacts 150 of FIG. 1.

The microelectronic device 900 of this example includes a first IMD layer 982 on the PMD layer 942. The microelectronic device 900 of this example further includes first interconnects 956 in the first IMD layer 982, on the contacts 950.

The hybrid component 902 includes a silicon recess nitride spacer 945 and a first WBG semiconductor material 944a in the silicon recess 946. The silicon recess nitride spacer 945 directs current to a bottom of the silicon recess 946 and provides more uniform current density between the first WBG semiconductor material 944a and the silicon 106. The hybrid component 902 of this example may further include a second WBG semiconductor material 944b in a WBG opening 966 through the PMD layer 942.

A combination of the first WBG semiconductor material 944a, and the second WBG semiconductor material 944b, provides a WBG structure 948 of the hybrid component 902. The WBG structure 948 has a lateral dimension adjacent to the silicon 906 that is no greater than 10 times a thickness of the WBG structure 948 or 10 times a depth of the silicon recess 946, whichever is greater, in at least one lateral direction. A combination of at least the n-type drift region 920, the p-type base well 928, and the n-type emitter 930 provide a silicon portion 958 of the hybrid component 902. The contacts 950 on the n-type emitter 930 provides a first current terminal 952 of the hybrid component 902. The first interconnects 956 on the WBG structure 948 provides a second current terminal 954 of the hybrid component 902.

The microelectronic device 900 may be operated with the p-type base well 928 biased above threshold, so that the hybrid component 902 is in an on state, in which case current may flow between the first current terminal 952 and the second current terminal 954, through the silicon portion 958 and the WBG structure 948. Also, the microelectronic device 900 may be operated with the p-type base well 928 biased below threshold, so that the hybrid component 902 is in an off state, in which case the second current terminal 954 of the hybrid component 902 may be biased at a high potential, for example, 30 volts to 1000 volts, with respect to the first current terminal 952, without causing the silicon 906 in the n-type drift region 920 to break down. In the off state, the WBG structure 948 may be depleted and thereby accommodate a significant portion of the potential difference between the second current terminal 954 and the first current terminal 952. The hybrid component 902 may accrue the advantage of a smaller area compared to an all-silicon component operating at the same potential difference. The hybrid component 902 of this example may be used to switch a high voltage input in a power circuit, or may be used to modulate a high voltage sensor input, by way of example. Inclusion of the first WBG semiconductor material 944a and the second WBG semiconductor material 944b in the WBG structure 948 may enable the hybrid component 902 to operate at a higher potential between the first current terminal 952 and the second current terminal 954 than would be possible with the first WBG semiconductor material 944a alone.

Figure 10:
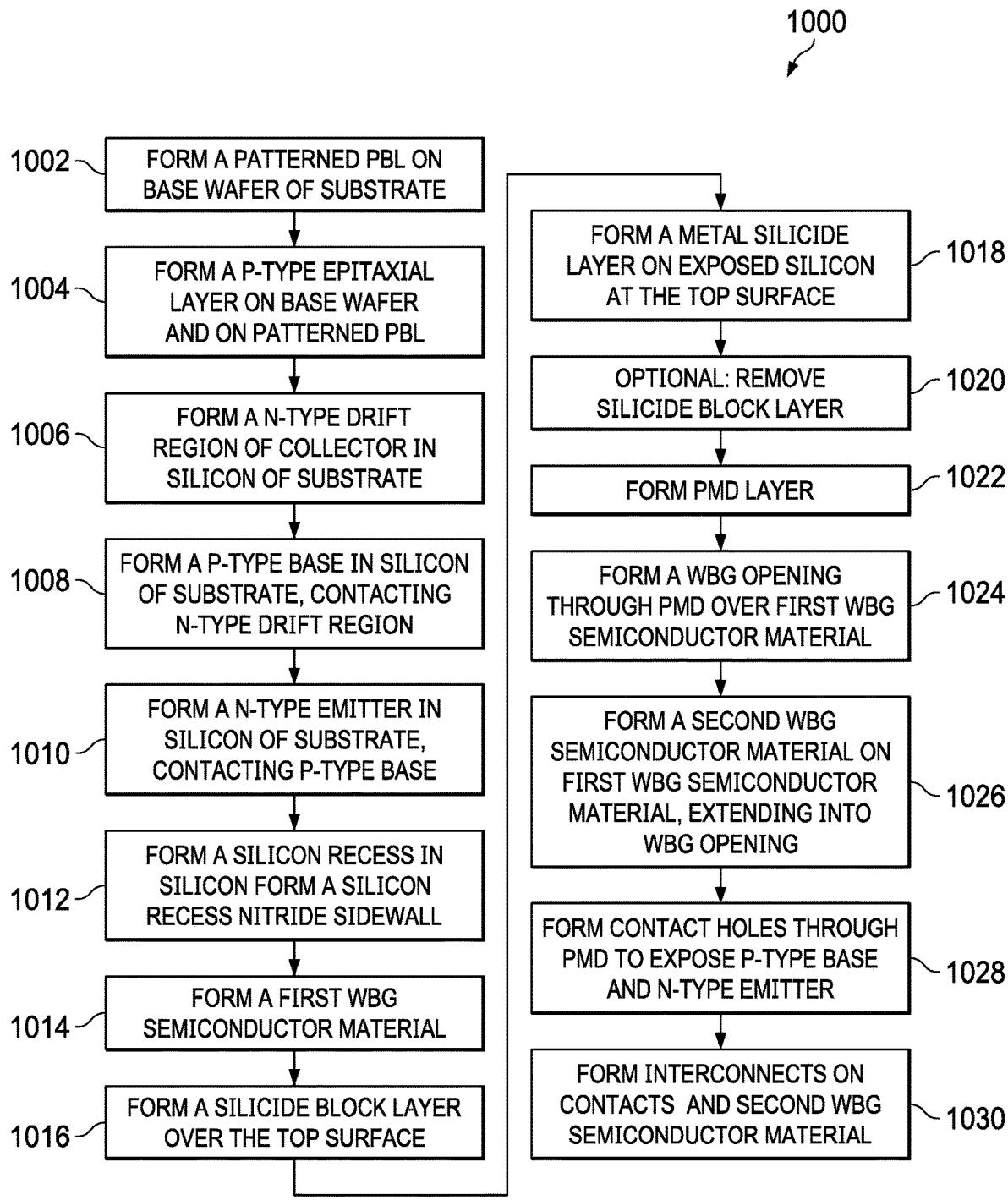
FIG. 10 presents a flowchart of an example method of forming the microelectronic device of FIG. 9.

FIG. 10 presents a flowchart of an example method 1000 of forming the microelectronic device 900 of FIG. 9. Structural elements referred to in the steps of the method 1000 are shown in FIG. 9. The method 1000 includes step 1002, which includes forming the patterned PBL 922 on the base wafer 910. The patterned PBL 922 may be formed by a process similar to the process disclosed in reference to step 202 of FIG. 2 for forming the PBL layer 122 of FIG. 1.

The method 1000 continues with step 1004, which includes forming the epitaxial layer 912 on the base wafer 910, extending over the patterned PBL 922. The epitaxial layer 912 may be formed by a process similar to the process disclosed in reference to step 202 of FIG. 2 for forming the epitaxial layer 112 of FIG. 1.

The method 1000 continues with step 1006, which includes forming the n-type drift region 920 in the silicon 906. The n-type drift region 920 may be formed by a process similar to the process disclosed in reference to step 206 of FIG. 2 for forming the n-type drift region 120 of FIG. 1, with appropriate adjustments in doses of the implanted n-type dopants.

The method 1000 continues with step 1008, which includes forming the p-type base well 928 in the silicon 906. The p-type base well 928 may be formed using an implant mask, not explicitly shown, and implanting boron for the p-type base well 928 into the epitaxial layer 912 where exposed by the implant mask. The boron may be implanted at a dose of $1\times10^{11}$ ions/cm$^2$ to $2\times10^{12}$ ions/cm$^2$, by way of example. After the boron is implanted, the substrate 904 is heated to diffuse and activate the implanted boron.

The method 1000 continues with step 1010, which includes forming the n-type emitter 930 in the silicon 906, surrounded by the p-type base well 928. The n-type emitter 930 may be formed using an implant mask, not explicitly shown, and implanting phosphorus, arsenic, or antimony for the n-type emitter 930 into the p-type base well 928 where exposed by the implant mask. The phosphorus, arsenic, or antimony may be implanted at a total dose of $1\times10^{14}$ ions/cm$^2$ to $1\times10^{16}$ ions/cm$^2$, by way of example. After the phosphorus, arsenic, or antimony is implanted, the substrate 104 is heated by a rapid thermal process or a flash anneal to activate the implanted boron.

The method 1000 continues with step 1012, which includes forming the silicon recess 946 in the silicon 906, and the formation of the silicon recess nitride spacer 945 within the silicon recess 946. The silicon recess 946 is initially defined using either a photoresist mask or a hard mask process. The hard mask can be a silicon nitride or silicon dioxide material. The silicon recess 946 is formed using either a plasma etch process or a wet etch process on the silicon 906 exposed by the hard mask. After the formation of the silicon recess 946, the silicon recess nitride spacer 945 may be formed by depositing one or more conformal layers of nitride dielectric material over the silicon recess 946. The nitride dielectric material is subsequently removed from horizontal surfaces, that is, surfaces generally parallel to the top surface 918 of the silicon 906, by an anisotropic etch process such as an RIE process, leaving the dielectric material on the lateral surfaces of the silicon recess 946. The upper edges of the silicon recess nitride spacer 945 may protrude above the top surface 918 of the silicon 906.

The method 1000 continues with step 1014 which includes the formation of the first WBG semiconductor material 944a. The first WBG semiconductor material 944a may be formed as a blanket film. After the formation of the first WBG semiconductor material 944a a photolithography process and a wet etch or plasma etch process may be used to remove the first WBG semiconductor material 944a from areas outside of the silicon recess 946, leaving the first WBG semiconductor material 944a in the silicon recess 946 region. Alternatively, a hard mask (not specifically shown) may be used to mask areas outside of the silicon recess 946 and a selective deposition process may be used to form the first WBG semiconductor material 944a in the silicon recess 946. After the selective deposition of the WBG semiconductor material 944, the hard mask is removed.

The method 1000 continues with step 1016, which includes forming a silicide block layer, not explicitly shown in FIG. 9, over the top surface 918 of the silicon 906 in an area for the first WBG semiconductor material 944a. The silicide block layer may include one or more sublayers of dielectric material that do not form silicide with an overlying metal layer during a silicide formation process. The silicide block layer may include silicon dioxide or silicon nitride, by way of example. The silicide block layer may have a thickness of 10 nanometers to 100 nanometers, for example. The silicide block layer may be formed by and LPCVD process or a PECVD process, for example. The silicon of the p-type base 988 and the silicon of the n-type emitter 930 are free of the silicide block layer, to enable formation of the metal silicide 936 on the p-type base 988, n-type emitter 930, and other regions of the silicon 906 which are not covered by the silicide block layer.

The method 1000 continues with step 1018, which includes forming the metal silicide 936 on the silicon 906 where exposed by the silicide block layer. In this example, the metal silicide 936 is formed at least on the p-type base 988, and the n-type emitter 930. The metal silicide 936 may be formed as disclosed in reference to step 222 of FIG. 2. Alternatively, the metal silicide 936 may be formed after contact holes for the contacts 950 are formed through the PMD layer 942 and the PMD liner 938, exposing the silicon 906 and the first WBG semiconductor material 944a. A layer of a metal such as titanium may be formed on the silicon 906 and WBG structure 948 exposed by the contact holes. The substrate 904 may subsequently be heated, reacting the titanium with the silicon 906 to form the metal silicide 936 at the bottoms of the contact holes.

The method 1000 continues with step 1020, which includes optionally removing the silicide block layer in the area for the first WBG semiconductor material 944a, to expose the top surface 918 of the first WBG semiconductor material 944a. The silicide block layer may be removed as disclosed in reference to step 408 of FIG. 4. Other methods for removing the silicide block layer are within the scope of step 1020.

The method 1000 continues with step 1022, which includes forming the PMD layer 942 over the PMD liner 938. The PMD layer 942 may be formed as disclosed in reference to step 226 of FIG. 2.

The method 1000 continues with step 1024 which includes forming a WBG opening 966 through the PMD layer 942. The WBG opening 966 through the PMD layer 942 may be formed by an RIE process using ions and fluorine radicals, which may provide straight sidewalls through the PMD layer 942. The RIE process may be terminated while there is at least a portion of the PMD layer 942 remaining over the first WBG semiconductor material 944a, advantageously preventing ion damage to the first WBG semiconductor material 944a. The WBG opening 966 through the PMD layer 942 may be formed by a remote plasma process, which may provide a desired etch selectivity to the first WBG semiconductor material 944a. The WBG opening 966 through the PMD layer 942 may be formed by a downstream plasma or an inductively coupled plasma (ICP) process that provides fluorine radicals and controlled energies for ions such as argon ions, which may provide a desired balance between sidewall profile and etch selectivity. Other methods of forming the WBG opening 966 are within the scope of this step 1026.

The method 1000 continues with step 1026, which includes forming the second WBG semiconductor material 944b on the first WBG semiconductor material 944a. The second WBG semiconductor material 944b may be formed as a blanket film. After the formation of the second WBG semiconductor material 944b CMP or etch-back process may be used to remove the second WBG semiconductor material 944b from areas outside of the WBG opening 966, such that second WBG semiconductor material 944b contacts the first WBG semiconductor material 944a in the WBG opening 966. Alternatively, a selective deposition process may be used to form the second WBG semiconductor material 944b directly in the WBG opening 966 on the first WBG semiconductor material 944a, filling the WBG opening 966 with the second WBG semiconductor material 944b.

The method 1000 continues with step 1028, which includes forming the contacts 950 through the PMD layer 942 to expose the silicon 906 of the p-type base 988 and the n-type emitter 930. The contacts 950 may be formed as disclosed in reference to step 228 of FIG. 2 for forming the contacts 150 of FIG. 1.

The method 1000 continues with step 1030 which includes forming the first interconnects 956 and the first IMD layer 982 on the PMD layer 942. The first interconnects 956 may be formed as disclosed in reference to step 230 of FIG. 2 for forming the interconnects 156 of FIG. 1. The first interconnects 956 make electrical contact with the contacts 950 and the WBG structure 948. For versions of step 1030 in which the first interconnects 956 are formed by an etched aluminum process, the first IMD layer 982 may be formed after the first interconnects 956 are formed. For versions of step 1030 in which the first interconnects 956 are formed by a damascene process, the first IMD layer 982 may be formed prior to forming the first interconnects 956. For versions of step 1032 in which the first interconnects 956 are formed by a plated interconnect process, the first IMD layer 982 may be formed after the first interconnects 956 are formed. The first IMD layer 982 may be formed by depositing one or more layers of dielectric material, and optionally planarizing the one or more layers by a dielectric CMP process.

Figure 11:
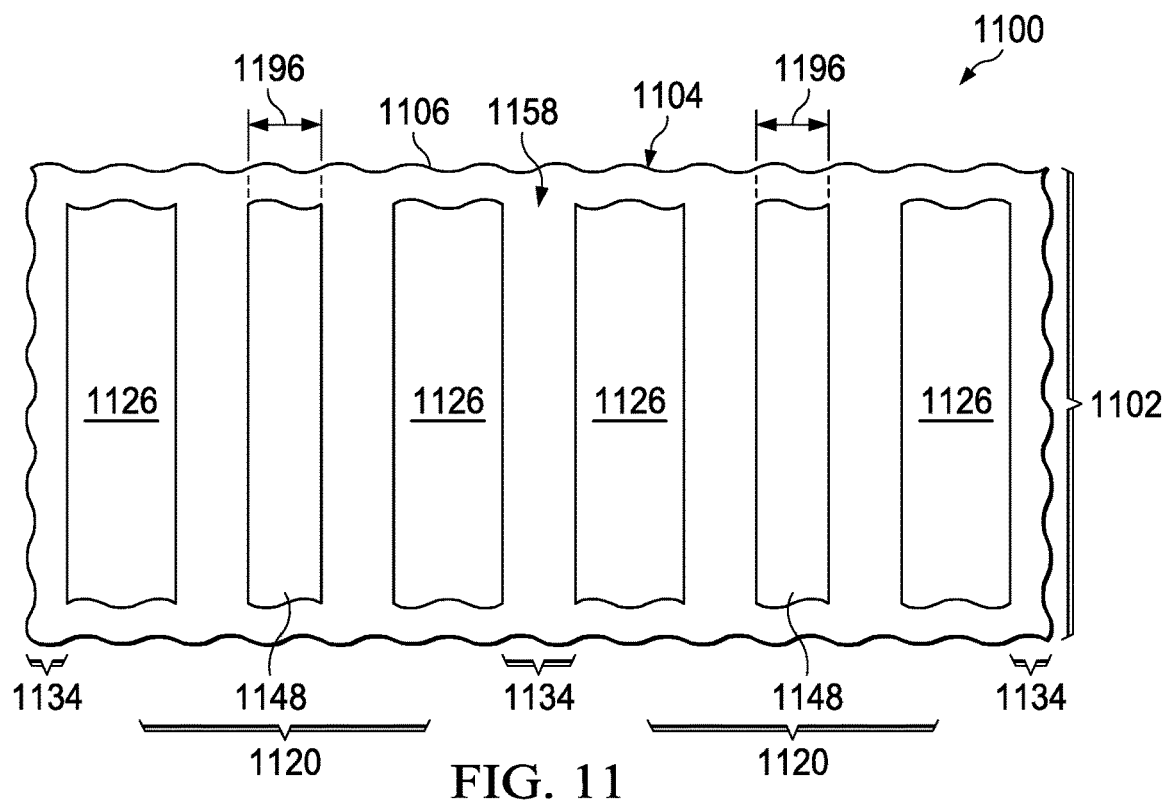
FIG. 11 is a top view of an example microelectronic device having a hybrid component with a WBG structure.

FIG. 11 is a top view of an example microelectronic device having a hybrid component with a WBG structure 1148. The microelectronic device 1100 may be manifested as any of the device types disclosed in reference to the microelectronic device 100 of FIG. 1. The hybrid component 1102 of this example is described as a DEMOS transistor, however, other manifestations of the hybrid component 1102 are within the scope of this example. The microelectronic device 1100 includes a substrate 1104 that has silicon semiconductor material 1106, referred to herein as the silicon 1106. The substrate 1104 may be manifested as any of the substrate types disclosed in reference to the substrate 104 of FIG. 1.

The hybrid component 1102 of this example includes an n-type drift region 1120 in the silicon 1106, configured in rows. The hybrid component 1102 of this example has a linear array configuration. The hybrid component 1102 includes a gate electrode 1126 over the silicon 1106, and an n-type source contact region 1134 in the silicon 1106, configured in rows adjacent to the gate electrode 1126, opposite from the n-type drift region 920. The n-type drift region 1120 and the n-type source contact region 1134 are parts of a silicon portion 1158 of the hybrid component 1102.

The hybrid component 1102 includes a WBG structure 1148 which extends in rows across the hybrid component 1102, over the n-type drift region 1120. The WBG structure 1148 has a lateral dimension 1196 adjacent to the silicon 1106 that is no greater than 10 times a thickness of the WBG structure 1148 or 10 times a depth of a recess in the silicon 1106 in which the WBG structure 1148 is formed, whichever is greater, in at least one lateral direction. In this example, the WBG structure 1148 may extend more than the lateral dimension 1196, in another lateral direction that is perpendicular to the lateral dimension 1196, as depicted in FIG. 11. Having the WBG structure 1148 with the lateral dimension 1196 adjacent to the silicon 1106 less than the lateral dimension 1196 in at least one lateral direction may advantageously facilitate forming the WBG structure 1148 in a monocrystalline state, due to limited buildup of lattice mismatch with respect to the silicon 1106 over the lateral dimension 1196.

Figure 12:
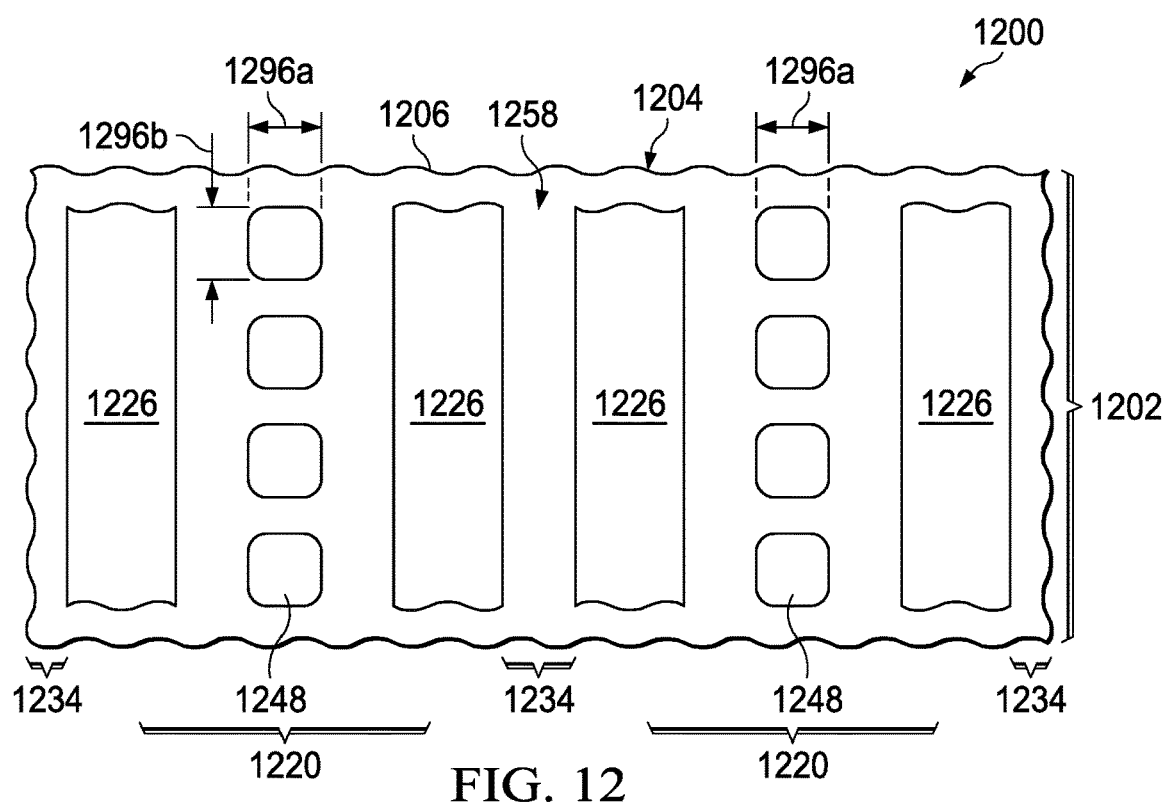
FIG. 12 is a top view of an example microelectronic device having a hybrid component with a WBG structure.

FIG. 12 is a top view of an example microelectronic device having a hybrid component with a WBG structure 1248. The microelectronic device 1200 may be manifested as any of the device types disclosed in reference to the microelectronic device 100 of FIG. 1. The hybrid component 1202 of this example is described as a DEMOS transistor, however, other manifestations of the hybrid component 1202 are within the scope of this example. The microelectronic device 1200 includes a substrate 1204 that has silicon semiconductor material 1206, referred to herein as the silicon 1206. The substrate 1204 may be manifested as any of the substrate types disclosed in reference to the substrate 104 of FIG. 1.

The hybrid component 1202 of this example has a linear array configuration. The hybrid component 1202 of this example includes an n-type drift region 1220 in the silicon 1206, a gate electrode 1226 over the silicon 1206, and an n-type source contact region 1234 in the silicon 1206, all configured in rows, as depicted in FIG. 12. The n-type drift region 1220 and the n-type source contact region 1234 are parts of a silicon portion 1258 of the hybrid component 1202.

The hybrid component 1202 includes a WBG structure 1248 which is formed as islands across the hybrid component 1202, over the n-type drift region 1220. In this example, the silicon 1206 between the islands of the WBG structure 1248 is part of the n-type drift region 1220. The WBG structure 1248 has a first lateral dimension 1296a adjacent to the silicon 1206 that is no greater than 10 times a thickness of the WBG structure 1248 or 10 times a depth of a recess in the silicon 1206 in which the WBG structure 1248 is formed, whichever is greater, in a first lateral direction. In this example, the WBG structure 1248 has a second lateral dimension 1296b adjacent to the silicon 1206 that is no greater than 10 times a thickness of the WBG structure 1248 or 10 times a depth of a recess in the silicon 1206 in which the WBG structure 1248 is formed, whichever is greater, in a second lateral direction, perpendicular to the first lateral direction, as depicted in FIG. 12. Having the WBG structure 1248 with the two lateral dimensions 1296a and 1296b adjacent to the silicon 1206 no greater than 10 times a thickness of the WBG structure 1248 or 10 times a depth of a recess in the silicon 1206, whichever is greater, in two lateral directions may advantageously facilitate forming the WBG structure 1244 in a monocrystalline state, due to limited buildup of lattice mismatch with respect to the silicon 1206 over the two lateral dimensions 1296a and 1296b. The islands of the WBG structure 1248 may be located close together, for example within a few microns, advantageously enabling a high current density through the WBG structure 1248 while maintaining low defects due to lattice mismatch.

Figure 13:
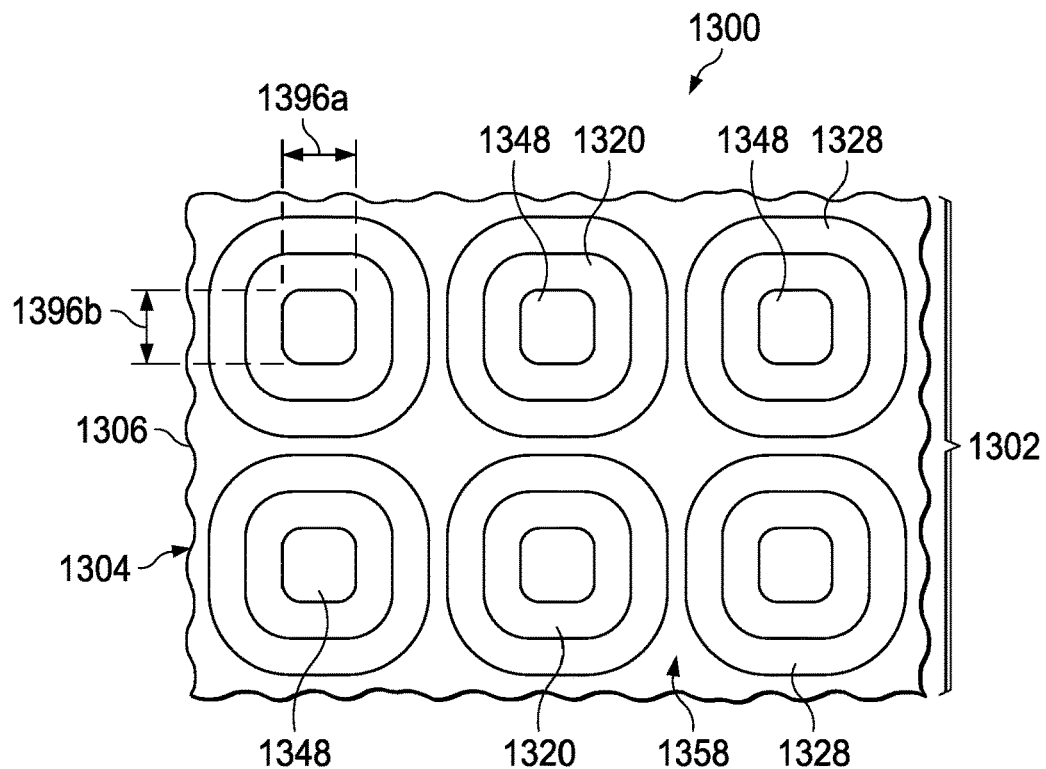
FIG. 13 is a top view of an example microelectronic device having a hybrid component with a WBG structure.

FIG. 13 is a top view of an example microelectronic device 1300 having a hybrid component 1302 with a WBG structure 1348. The microelectronic device 1300 may be manifested as any of the device types disclosed in reference to the microelectronic device 100 of FIG. 1. The hybrid component 1302 of this example is described as a bipolar junction transistor, however, other manifestations of the hybrid component 1302 are within the scope of this example. The microelectronic device 1300 includes a substrate 1304 that has silicon semiconductor material 1306, referred to herein as the silicon 1306. The substrate 1304 may be manifested as any of the substrate types disclosed in reference to the substrate 104 of FIG. 1.

The hybrid component 1302 of this example has a two dimensional rectangular array configuration. The hybrid component 1302 includes a WBG structure 1348 which is formed as islands across the hybrid component 1302. The hybrid component 1302 of this example includes an n-type drift region 1320 in the silicon 1306, laterally surrounding each of the islands of the WBG structure 1348. The n-type drift region 1320 is part of a collector of the hybrid component 1302.

The hybrid component 1302 includes a p-type base well 1328 in the silicon 1306, laterally surrounding each of the islands of the WBG structure 1348, and laterally separated from the islands by the n-type drift region 1320. The n-type drift region 1320 and the p-type base well 1328 are part of a silicon portion 1358 of the hybrid component 1302. The silicon portion 1358 laterally surrounds each of the islands of the WBG structure 1348, in this example. The WBG structure 1348 has a first lateral dimension 1396a adjacent to the silicon 1306 that is no greater than 10 times a thickness of the WBG structure 1348 or 10 times a depth of a recess in the silicon 1306 in which the WBG structure 1348 is formed, whichever is greater, in a first lateral direction. In this example, the WBG structure 1348 has a second lateral dimension 1396b adjacent to the silicon 1306 that is no greater than 10 times a thickness of the WBG structure 1348 or 10 times a depth of a recess in the silicon 1306 in which the WBG structure 1348 is formed, whichever is greater, in a second lateral direction, perpendicular to the first lateral direction, as depicted in FIG. 13. Having the WBG structure 1348 with the two lateral dimensions 1396a and 1396b adjacent to the silicon 1306 limited as disclosed may accrue the advantages disclosed in reference to the islands of the WBG structure 1248 of FIG. 12. The two dimensional rectangular array configuration of this example may advantageously provide more uniform electric fields in the silicon 1306 compared to linear configurations.

Figure 14:
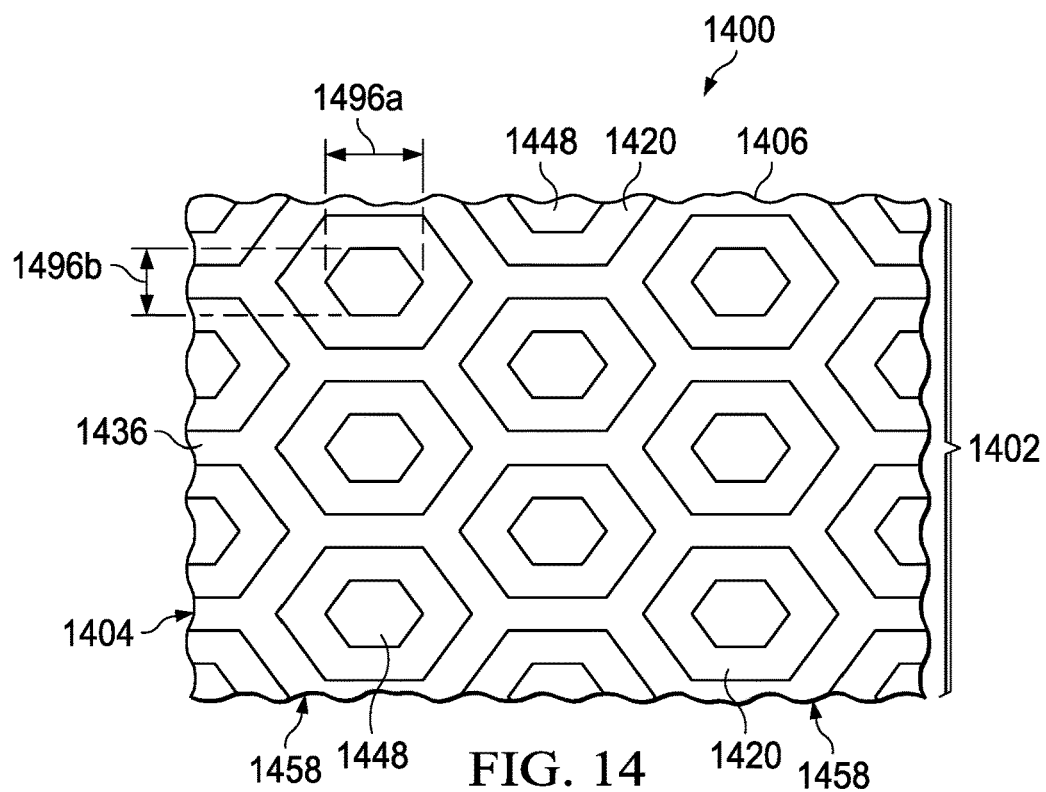
FIG. 14 is a top view of an example microelectronic device having a hybrid component with a WBG structure.

FIG. 14 is a top view of an example microelectronic device 1400 having a hybrid component 1402 with a WBG structure 1448. The microelectronic device 1400 may be manifested as any of the device types disclosed in reference to the microelectronic device 100 of FIG. 1. The hybrid component 1402 of this example is described as a Schottky diode, however, other manifestations of the hybrid component 1402 are within the scope of this example. The microelectronic device 1400 includes a substrate 1404 that has silicon semiconductor material 1406, referred to herein as the silicon 1406. The substrate 1404 may be manifested as any of the substrate types disclosed in reference to the substrate 104 of FIG. 1.

The hybrid component 1402 of this example has a two dimensional hexagonal array configuration. The hybrid component 1402 includes a WBG structure 1448 which is formed as islands across the hybrid component 1402. The hybrid component 1402 of this example includes an n-type drift region 1420 in the silicon 1406, laterally surrounding each of the islands of the WBG structure 1448. The n-type drift region 1420 is part of a cathode of the hybrid component 1402.

The hybrid component 1402 includes metal silicide 1436 on the silicon 1406, laterally surrounding each of the islands of the WBG structure 1448, and laterally separated from the islands by the n-type drift region 1420. The n-type drift region 1420 is part of a silicon portion 1458 of the hybrid component 1402. The silicon portion 1458 laterally surrounds each of the islands of the WBG structure 1448, in this example. The WBG structure 1448 has a first lateral dimension 1496a adjacent to the silicon 1406 in a first lateral direction, and a second lateral dimension 1496b adjacent to the silicon 1406 in a second lateral direction, perpendicular to the first lateral direction, as depicted in FIG. 14. Both the first lateral dimension 1496a and the second lateral dimension 1496b are no greater than 10 times a thickness of the WBG structure 1448 or 10 times a depth of a recess in the silicon 1406 in which the WBG structure 1448 is formed, whichever is greater. Having the WBG structure 1448 with the two lateral dimensions 1496a and 1496b adjacent to the silicon 1406 limited as disclosed may accrue the advantages disclosed in reference to the islands of the WBG structure 1248 of FIG. 12. The two dimensional hexagonal array configuration of this example may advantageously provide higher current densities in the hybrid component 1402 compared to two dimensional array configurations.

Figure 15:
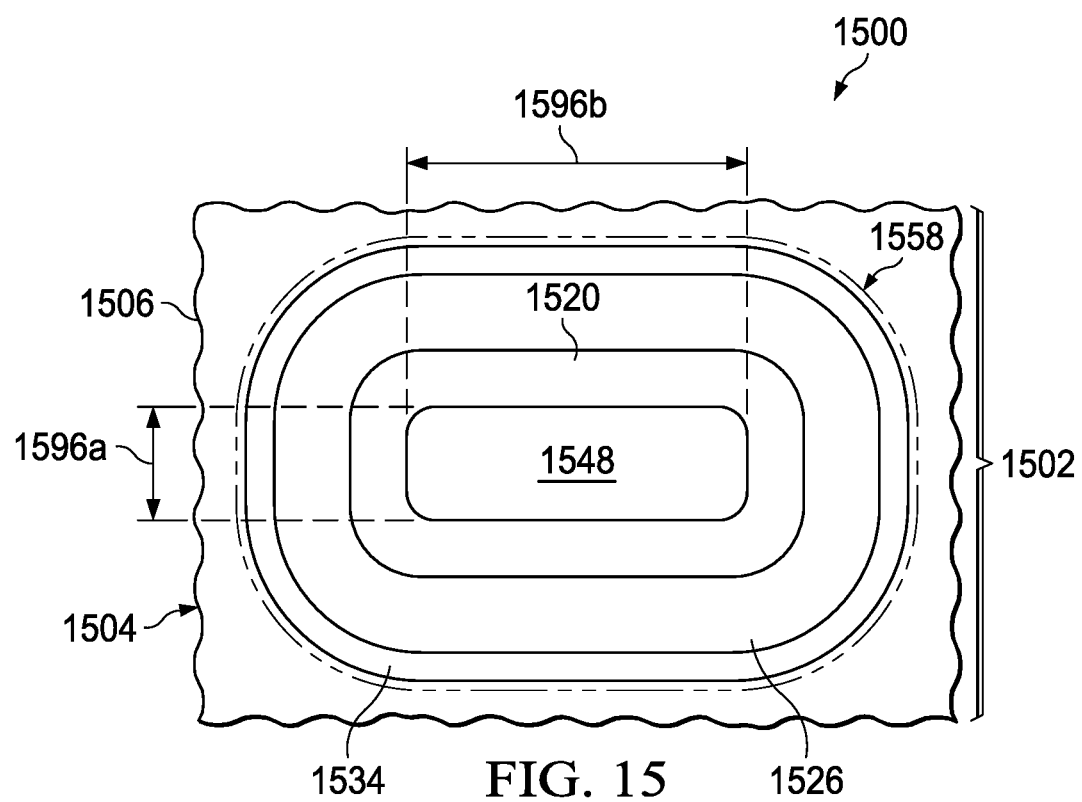
FIG. 15 is a top view of an example microelectronic device having a hybrid component with a WBG structure.

FIG. 15 is a top view of an example microelectronic device 1500 having a hybrid component 1502 with a WBG structure 1548. The microelectronic device 1500 may be manifested as any of the device types disclosed in reference to the microelectronic device 100 of FIG. 1. The hybrid component 1502 of this example is described as a DEMOS transistor, however, other manifestations of the hybrid component 1502 are within the scope of this example. The microelectronic device 1500 includes a substrate 1504 that has silicon semiconductor material 1506, referred to herein as the silicon 1506. The substrate 1504 may be manifested as any of the substrate types disclosed in reference to the substrate 104 of FIG. 1.

The hybrid component 1502 of this example includes a WBG structure 1548, configured in a single island on the silicon 1506. The WBG structure 1548 has a first lateral dimension 1596a adjacent to the silicon 1506 that is no greater than 10 times a thickness of the WBG structure 1548 or 10 times a depth of a recess in the silicon 1506 in which the WBG structure 1548 is formed, whichever is greater, in at least one lateral direction. In this example, the WBG structure 1548 has a second lateral dimension 1596b adjacent to the silicon 1506 in a second lateral direction, perpendicular to the first lateral direction, which may be greater than the first lateral dimension 1596a, as indicated in FIG. 15.

The hybrid component 1502 includes an n-type drift region 1520 in the silicon 1506, laterally surrounding the WBG structure 1548. The hybrid component 1502 further includes a gate electrode 1526 over the silicon 1506, laterally surrounding the n-type drift region 1520, and an n-type source contact region 1534 in the silicon 1506, laterally surrounding the gate electrode 1526. Having the WBG structure 1548 with the first lateral dimension 1596a adjacent to the silicon 1506 that is no greater than 10 times a thickness of the WBG structure 1548 or 10 times a depth of a recess in the silicon 1506 in which the WBG structure 1548 is formed, may advantageously provide a desired current through the hybrid component 1502 while maintaining low defects due to lattice mismatch.

Various features of the examples disclosed herein may be combined in other manifestations of example microelectronic devices. For example, any of the hybrid components 102 through 1502 may be manifested as an LDMOS transistor, a DEMOS transistor, a bipolar junction transistor, a junction field effect transistor (JFET), or a diode. Any of the WBG semiconductor materials 144 through 1544 may include one or more group IV semiconductor materials, III-V compound semiconductor materials, II-VI semiconductor materials, perovskite semiconductor materials, magnesium oxide, or magnesium sulfide. Any of the hybrid components 102 through 1502 may have a silicon recess 146 through 946 in the silicon 106 through 1506 below the WBG structures 148 through 1548, similar to the silicon recess 546. Any of the hybrid components 102 through 1502 may have a heavily doped region in the silicon 106 through 1506 below the WBG structure 148 through 1548, similar to the n-type heavily doped region 768. Any of the WBG structures 148 through 1548 may include an interface layer 560 between the WBG semiconductor materials 144 through 1544 and the silicon 106 through 1506, similar to the interface layer 560. Any of the hybrid components 102 through 1502 may have the WBG semiconductor materials 144 through 1544 in direct contact with the silicon 106 through 1506, similar to the hybrid components 102, 302, 702, or 902. Any of the WBG semiconductor materials 144 through 1544 may include a WBG gradient silicon material with a varying composition and a varying lattice constant, similar to the WBG gradient semiconductor material 143. Any of the WBG semiconductor materials 144 through 1544 may include a first WBG semiconductor material and a second WBG semiconductor material on the first WBG semiconductor material, similar to the first WBG semiconductor material 944*a* and the second WBG semiconductor material 944*b*. Any of the WBG semiconductor materials 144 through 1544 may extend in rows across the hybrid components 102 through 1502, similar to the WBG semiconductor material 1144 as shown in FIG. 11. Any of the WBG semiconductor materials 144 through 1544 may be formed as islands across the hybrid components 102 through 1502, similar to the WBG semiconductor material 1244 as shown in FIG. 12. Any of the hybrid components 102 through 1502 may be configured with the WBG semiconductor materials 144 through 1544 laterally surrounded by the silicon portions 158 through 1558, similar to the hybrid components 1302, 1402, or 1502, as shown in FIG. 13 through FIG. 15. Any of the hybrid components 102 through 1502 may have a field plate adjacent to the WBG semiconductor materials 144 through 1544, similar to the field plates 140 and 564.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a hybrid component;
   a substrate including silicon;
   a silicon portion of the hybrid component, the silicon portion being in the silicon;
   a first current terminal of the hybrid component on the silicon portion of the hybrid component;
   a wide bandgap (WBG) structure including WBG semiconductor material, at least partially in a recess of the silicon, the recess including a nitride spacer, the WBG semiconductor material having a bandgap energy greater than a bandgap energy of the silicon; and
   a second current terminal of the hybrid component on the WBG structure.

2. The microelectronic device of claim 1, wherein the WBG semiconductor material includes a semiconductor material selected from the group consisting of a group IV semiconductor, a group III-V compound semiconductor, and a group II-VI compound semiconductor.

3. The microelectronic device of claim 1, wherein the hybrid component corresponds to a laterally diffused metal oxide semiconductor (LDMOS) transistor, a drain extended metal oxide semiconductor (DEMOS) transistor, a bipolar junction transistor, a junction field effect transistor, a gated bipolar, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, or a Schottky diode.

4. The microelectronic device of claim 1, wherein the nitride spacer includes a dielectric nitride selected from the group consisting of silicon nitride, boron nitride, and aluminum nitride.

5. The microelectronic device of claim 1, wherein the WBG semiconductor material includes a first layer adjacent to the silicon having a first lattice constant, and includes a second layer contacting the first layer having a second lattice constant, wherein the first lattice constant is between the second lattice constant and a lattice constant of the silicon.

6. The microelectronic device of claim 1, wherein the silicon immediately below the WBG semiconductor material has an average dopant concentration greater than $1 \times 10^{19}$ atoms/cm$^3$.

7. The microelectronic device of claim 1, wherein the WBG structure includes a metal silicide layer between the WBG semiconductor material and the silicon.

8. The microelectronic device of claim 1, wherein the WBG structure includes an interface layer between the WBG semiconductor material and the silicon, the interface layer including a material selected from the group consisting of a refractory metal, a metal of a platinum group, a two-dimensional materials, and a rare earth metal.

9. The microelectronic device of claim 1, wherein the WBG structure includes a contact layer on the WBG semiconductor material.

10. The microelectronic device of claim 1, wherein the hybrid component includes a field plate laterally surrounding the WBG semiconductor material.

11. The microelectronic device of claim 1, wherein the nitride spacer includes a dielectric material selected from the group consisting of silicon nitride and boron nitride.

12. The microelectronic device of claim 1, wherein the WBG semiconductor material is a first WBG semiconductor material, and the WBG structure includes a second WBG semiconductor material on the first WBG semiconductor material.

13. The microelectronic device of claim 1, wherein the WBG semiconductor material has at least one lateral dimension adjacent to the silicon that is no greater than 10 times a thickness of the WBG semiconductor material or 10 times a depth of the recess in the silicon in which the WBG semiconductor material is located, whichever is greater.

14. The microelectronic device of claim 1, wherein the hybrid component is configured to have current between the first current terminal and the second current terminal pass through a boundary between the WBG structure and the silicon.

15. The microelectronic device of claim 1, wherein the hybrid component include an implant control layer adjacent to the silicon recess.

16. The microelectronic device of claim 1, wherein the WBG structure includes an interface layer between the WBG semiconductor material and the silicon, the interface layer including one or more metals, graphene, two dimensional metal carbide, metal carbonitride, a metal nitride, chalcogenides, hexagonal boron nitride, rare earth metals, metal silicide and two dimensional tin or molybdenum compounds.

17. The microelectronic device of claim 16, wherein the WBG structure further includes a cap layer on the interface layer.

18. The microelectronic device of claim 9, wherein the contact layer includes a metal such as titanium or tungsten silicide.

19. The microelectronic device of claim 1, wherein the WBG semiconductor material includes a first portion of a first conductivity type and a second portion of a second conductivity type opposite the first conductivity type.

20. The microelectronic device of claim 12, wherein the second WBG semiconductor material is located outside the recess.

* * * * *